US012655323B2

(12) United States Patent

Jun et al.

(10) Patent No.: US 12,655,323 B2
(45) Date of Patent: Jun. 16, 2026

(54) ADHESIVE TRANSFER FILM AND METHOD FOR MANUFACTURING POWER MODULE SUBSTRATE BY USING SAME

(71) Applicant: AMOSENSE CO., LTD., Cheonan-si (KR)

(72) Inventors: Younghwan Jun, Cheonan-si (KR); Kyungwhan Woo, Cheonan-si (KR); Yongsul Song, Cheonan-si (KR)

(73) Assignee: AMOSENSE CO., LTD., Cheonan-si (KR)

( * ) Notice: Subject to any disclaimer, the term of this patent is extended or adjusted under 35 U.S.C. 154(b) by 742 days.

(21) Appl. No.: 17/921,966

(22) PCT Filed: Apr. 28, 2021

(86) PCT No.: PCT/KR2021/005373

§ 371 (c)(1),
(2) Date: Oct. 27, 2022

(87) PCT Pub. No.: WO2021/221460

PCT Pub. Date: Nov. 4, 2021

(65) Prior Publication Data

US 2023/0178509 A1 Jun. 8, 2023

(30) Foreign Application Priority Data

Apr. 28, 2020 (KR) ........................ 10-2020-0051778
May 4, 2020 (KR) ........................ 10-2020-0053136
May 4, 2020 (KR) ........................ 10-2020-0053480

(51) Int. Cl.
*C09J 5/06* (2006.01)
*C09J 7/25* (2018.01)
(Continued)

(52) U.S. Cl.
CPC . *C09J 7/35* (2018.01); *C09J 5/06* (2013.01); *C09J 11/04* (2013.01); *H10W 90/00* (2026.01);
(Continued)

(58) Field of Classification Search
CPC ... H01L 24/29; H01L 24/83; C09J 5/06; C09J 7/255
See application file for complete search history.

(56) References Cited

U.S. PATENT DOCUMENTS 11,315,868 B2     4/2022   Oohiraki et al.
2004/0127626 A1*  7/2004   Yoshiko ................. H05K 3/321
                                                          524/440
(Continued)

FOREIGN PATENT DOCUMENTS

CN        111066137 A      4/2020
JP        2019-052366 A    4/2019
(Continued)

OTHER PUBLICATIONS

JP Office Action dated Dec. 19, 2023 as received in Application No. 2022-565929.
CN Office Action dated Jan. 5, 2024 as received in Application No. 202180045549.0.

*Primary Examiner* — Dale E Page
*Assistant Examiner* — Wilner Jean Baptiste
(74) *Attorney, Agent, or Firm* — Maschoff Brennan

(57) ABSTRACT

The present disclosure relates to an adhesive transfer film for bonding a semiconductor chip and a spacer to a substrate and a method for manufacturing a power module substrate by using same, the adhesive transfer film being obtained by manufacturing an Ag sintering paste in the form of a film. The present disclosure can reduce the process time by minimizing a sintering process, and can reduce equipment investment cost.

17 Claims, 32 Drawing Sheets

(51) Int. Cl.

| | |
|---|---|
| *C09J 7/35* | (2018.01) |
| *C09J 11/04* | (2006.01) |
| *H10W 90/00* | (2026.01) |
| *H10W 72/00* | (2026.01) |
| *H10W 72/30* | (2026.01) |

(52) U.S. Cl.
CPC ..... *H10W 90/401* (2026.01); *C09J 2203/326* (2013.01); *C09J 2301/204* (2020.08); *C09J 2301/208* (2020.08); *C09J 2301/408* (2020.08); *C09J 2301/502* (2020.08); *H10W 72/01304* (2026.01); *H10W 72/01323* (2026.01); *H10W 72/07304* (2026.01); *H10W 72/07331* (2026.01); *H10W 72/07341* (2026.01); *H10W 72/07353* (2026.01); *H10W 72/321* (2026.01); *H10W 72/322* (2026.01); *H10W 72/334* (2026.01); *H10W 72/352* (2026.01); *H10W 90/734* (2026.01)

(56) References Cited

U.S. PATENT DOCUMENTS

| | | | |
|---|---|---|---|
| 2015/0103275 A1* | 4/2015 | Park | G06F 3/041 |
| | | | 349/12 |
| 2018/0016471 A1 | 1/2018 | Kamochi et al. | |
| 2019/0348327 A1* | 11/2019 | Harada | H10P 54/00 |
| 2020/0048504 A1 | 2/2020 | Sugo et al. | |
| 2020/0277515 A1 | 9/2020 | Ichikawa et al. | |
| 2021/0057372 A1 | 2/2021 | Oh et al. | |

FOREIGN PATENT DOCUMENTS

| | | | |
|---|---|---|---|
| KR | 2017-0125350 A | 11/2017 |
| KR | 2019-0110376 A | 9/2019 |
| KR | 2019-0130152 A | 11/2019 |
| KR | 2020-0039735 A | 4/2020 |
| WO | 2019180914 A1 | 9/2019 |

* cited by examiner

[FIG. 1]
<u>10</u>
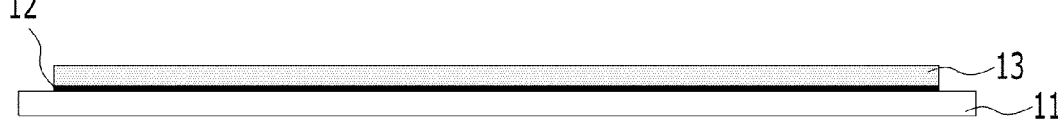

[FIG. 2]
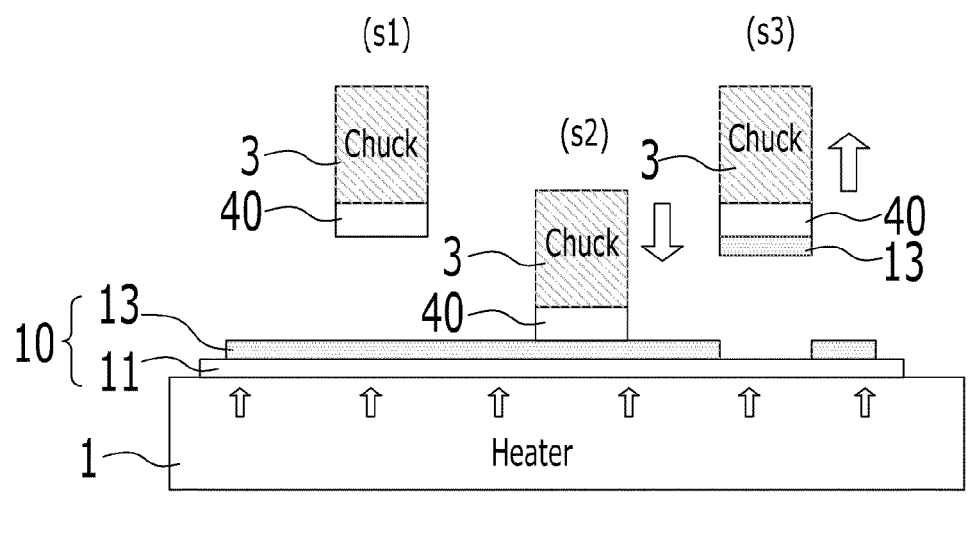
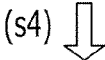
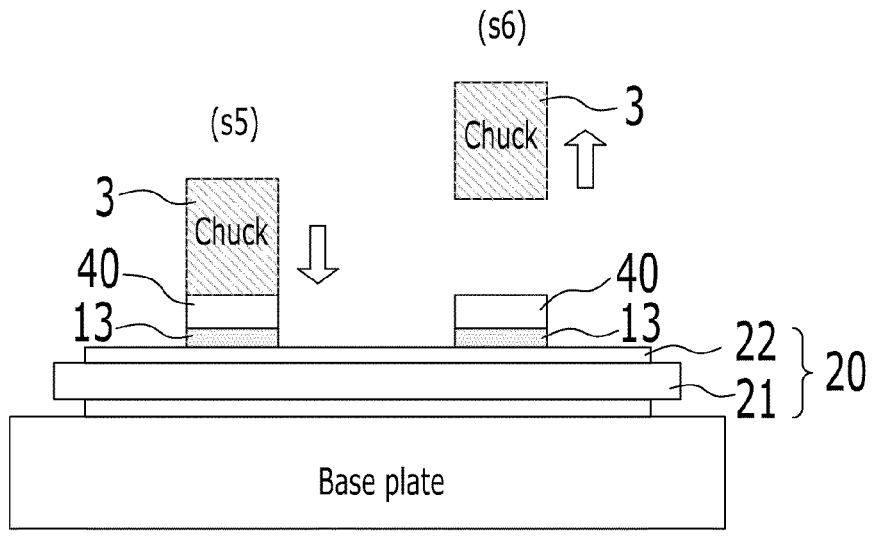

[FIG. 3]
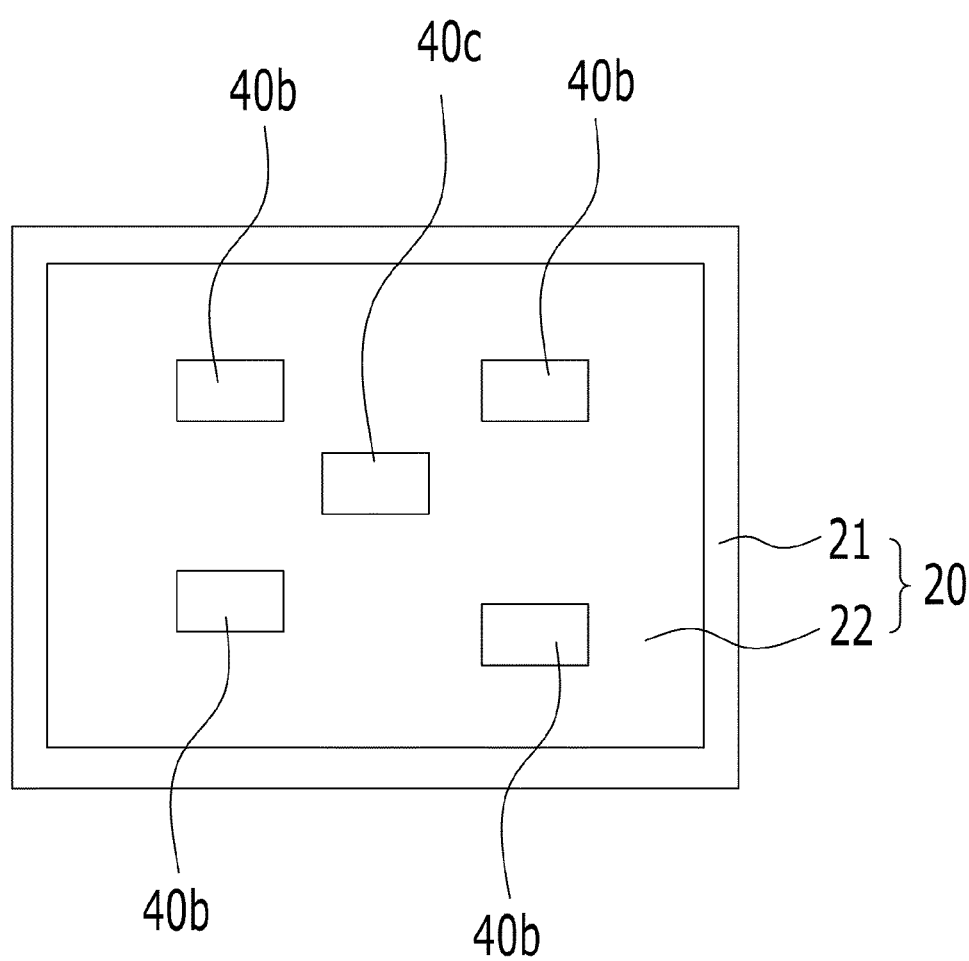

[FIG. 4A]
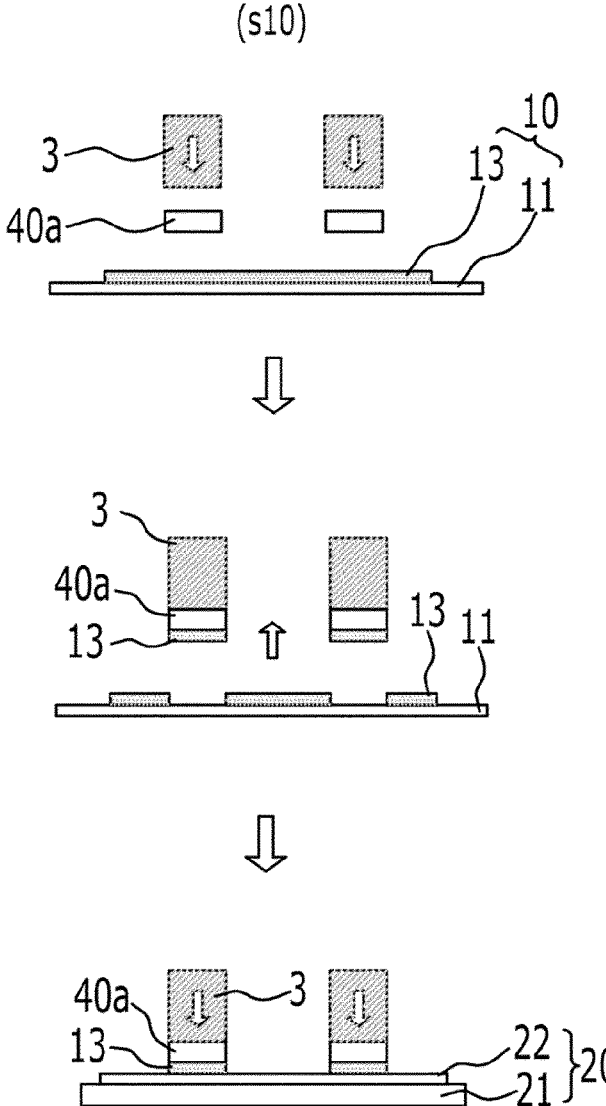

[FIG. 4B]
(s20)
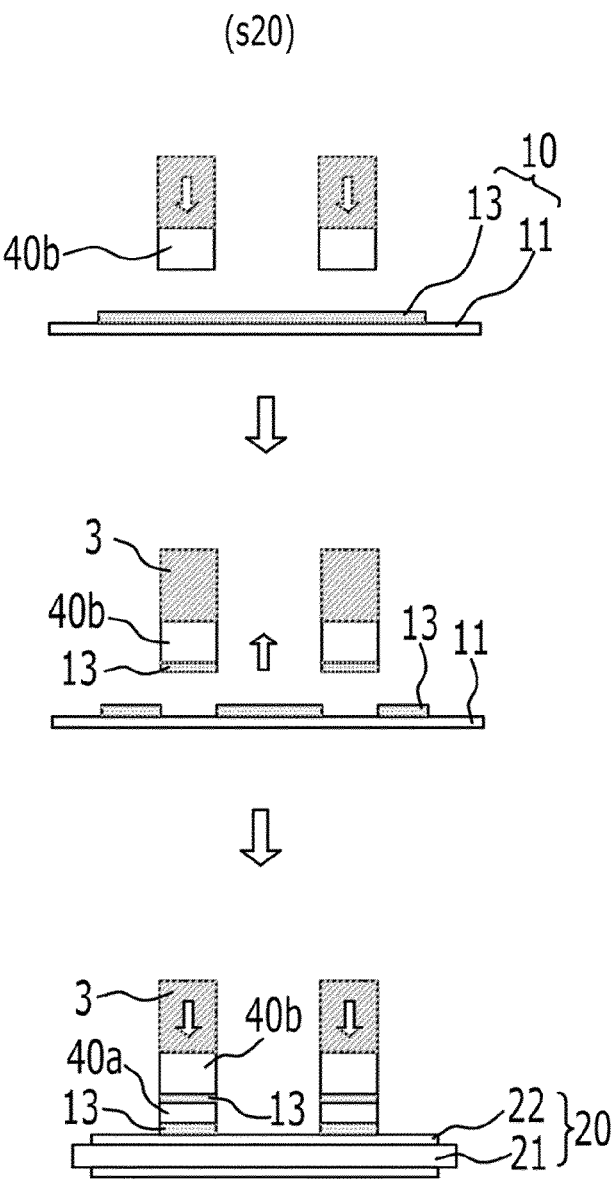

[FIG. 4C]
(s30)
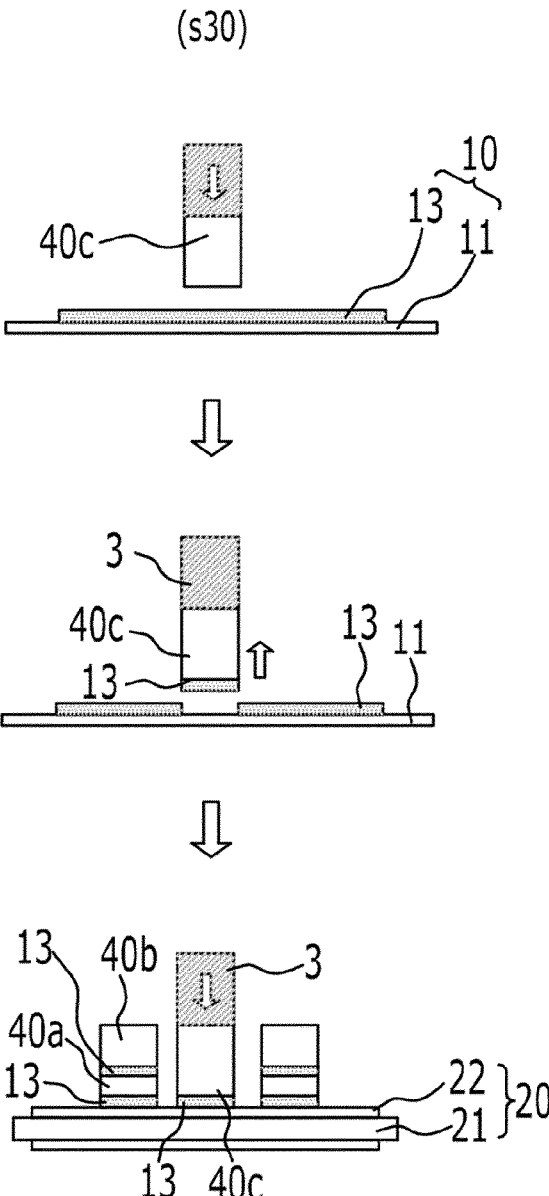

[FIG. 4D]
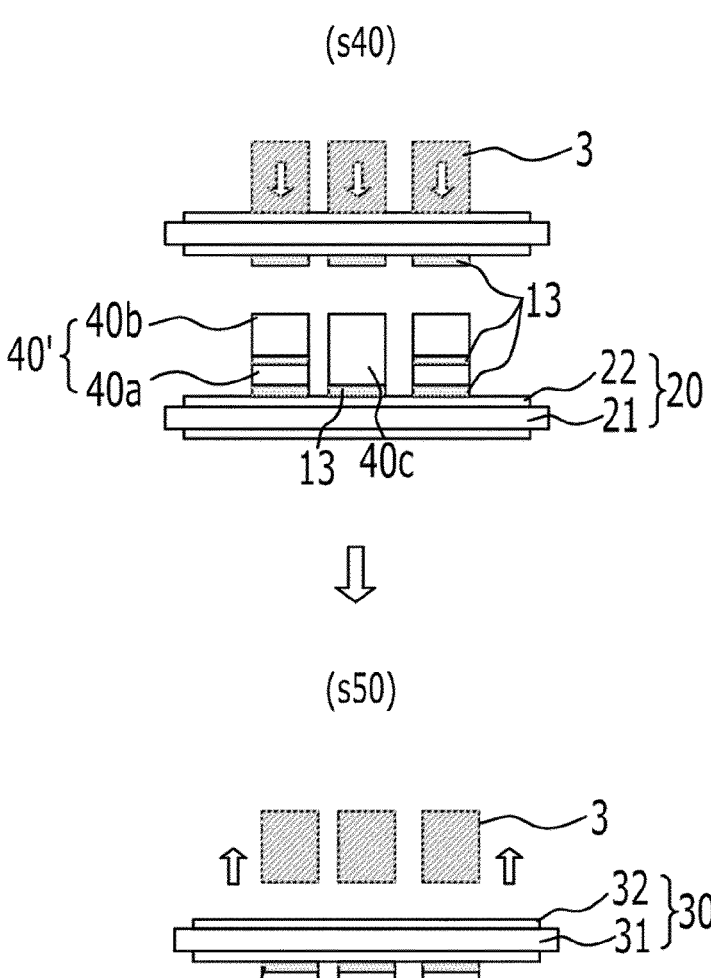

[FIG. 5]
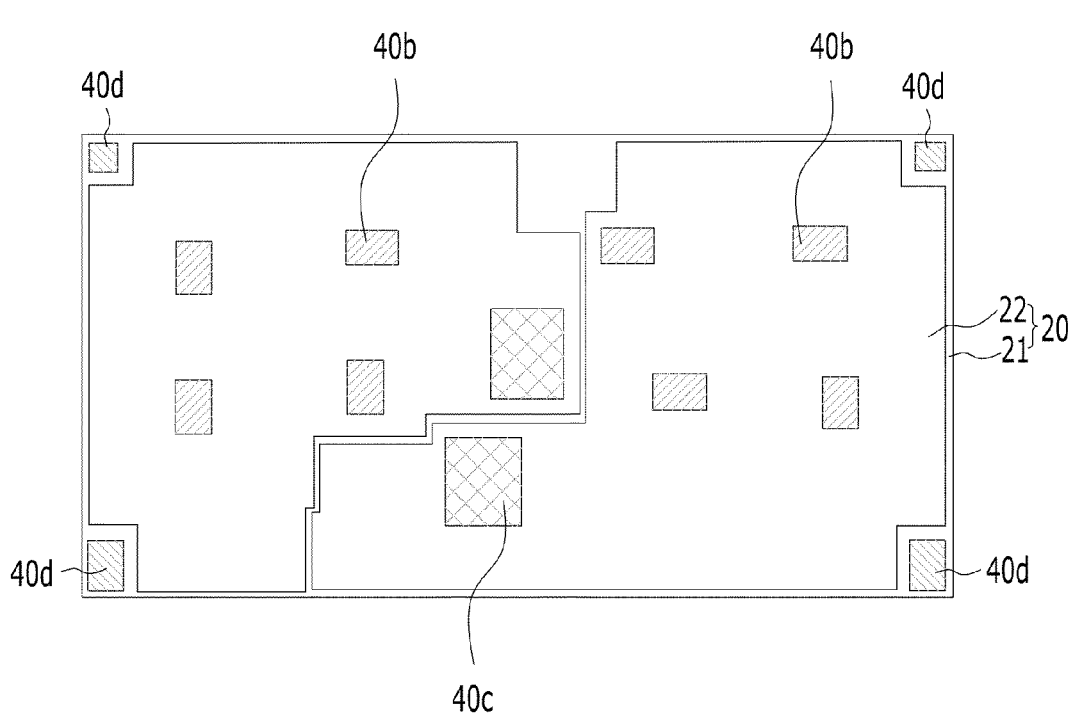

[FIG. 6]
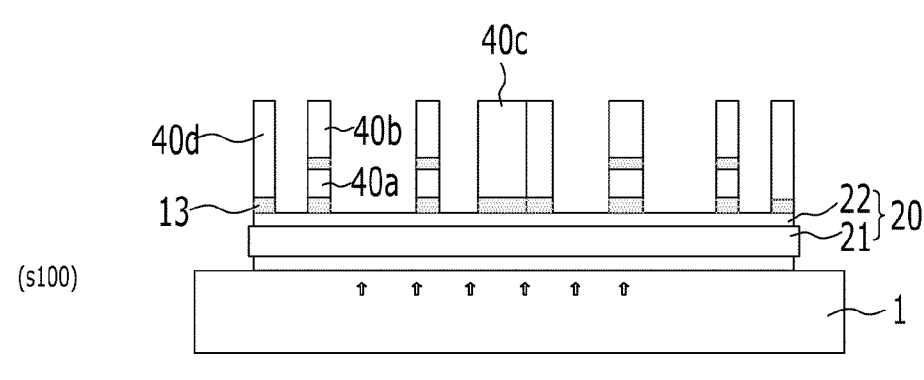
(s100)
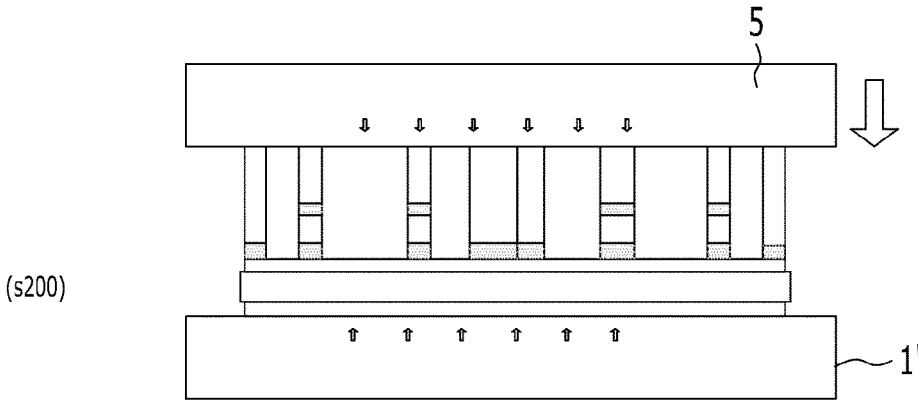
(s200)
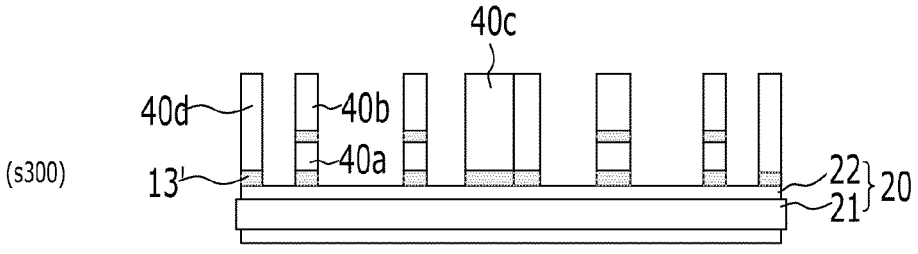
(s300)

[FIG. 8]
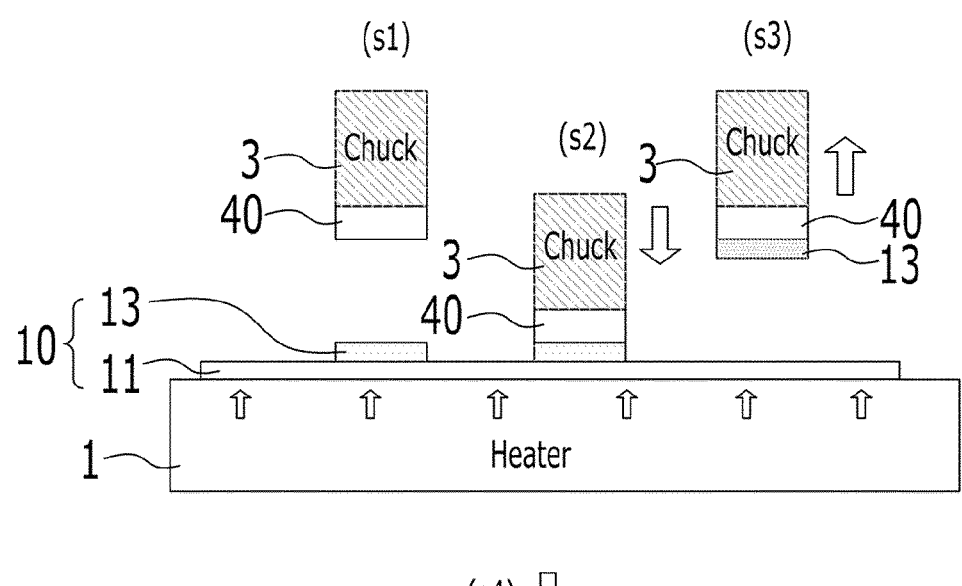
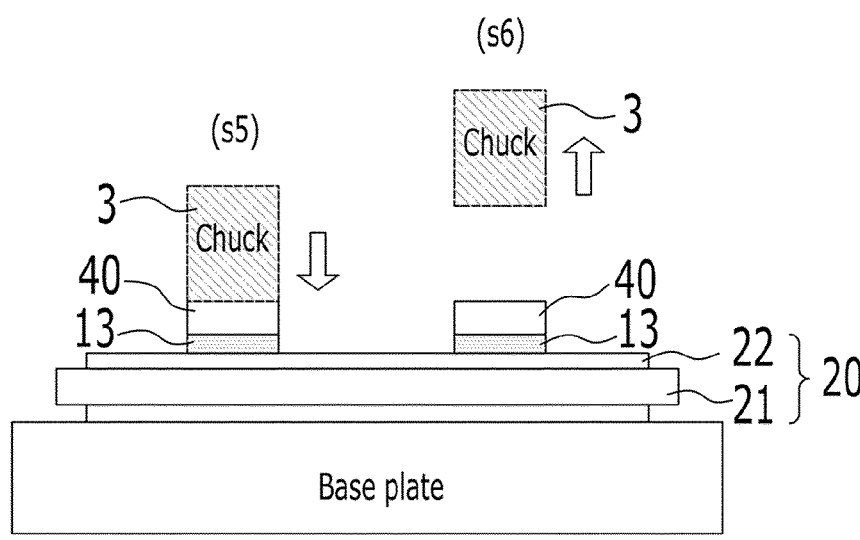

[FIG. 9A]
(s10)
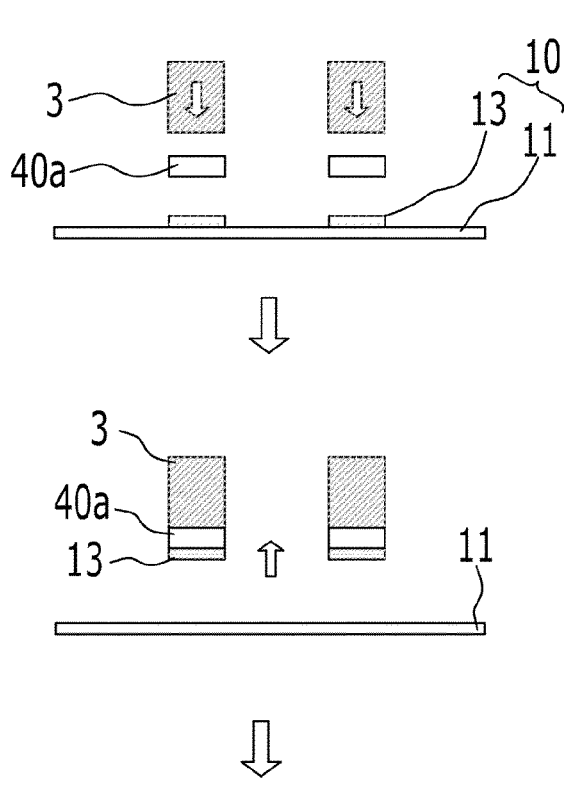
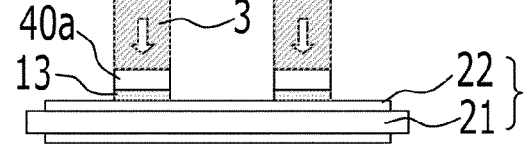

[FIG. 9B]
(s20)
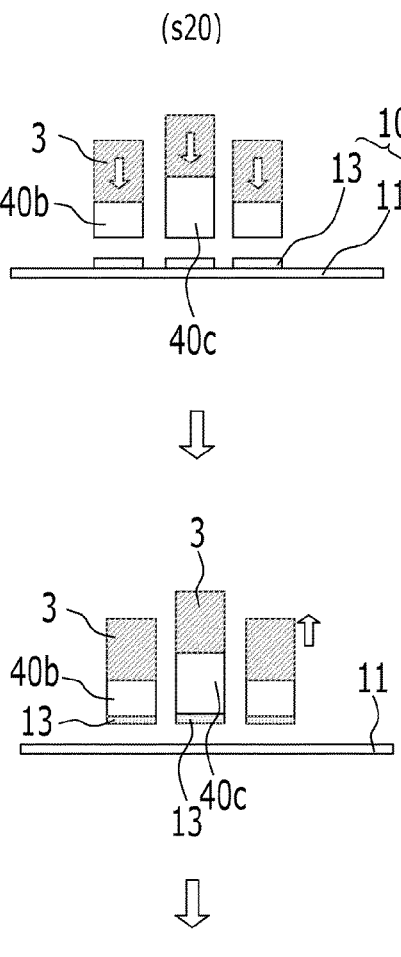
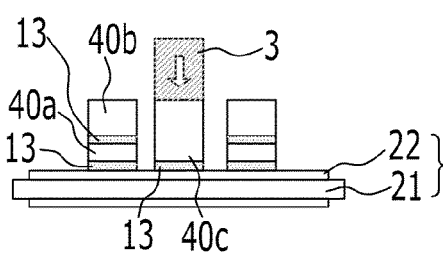

[FIG. 9C]
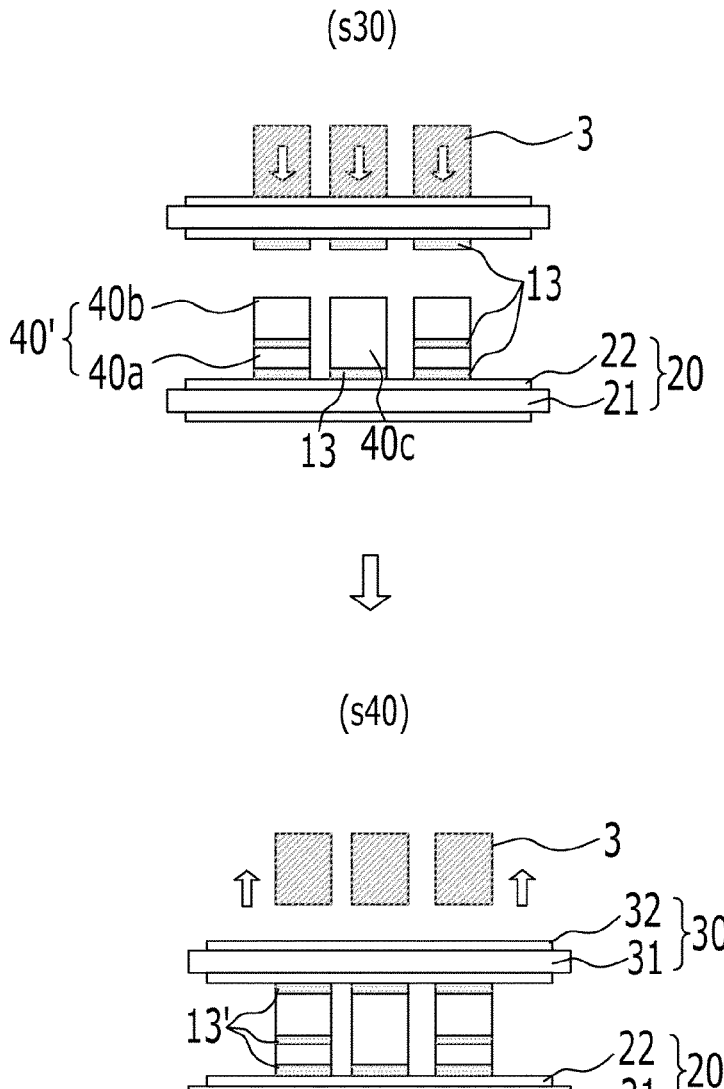

[FIG. 10A]
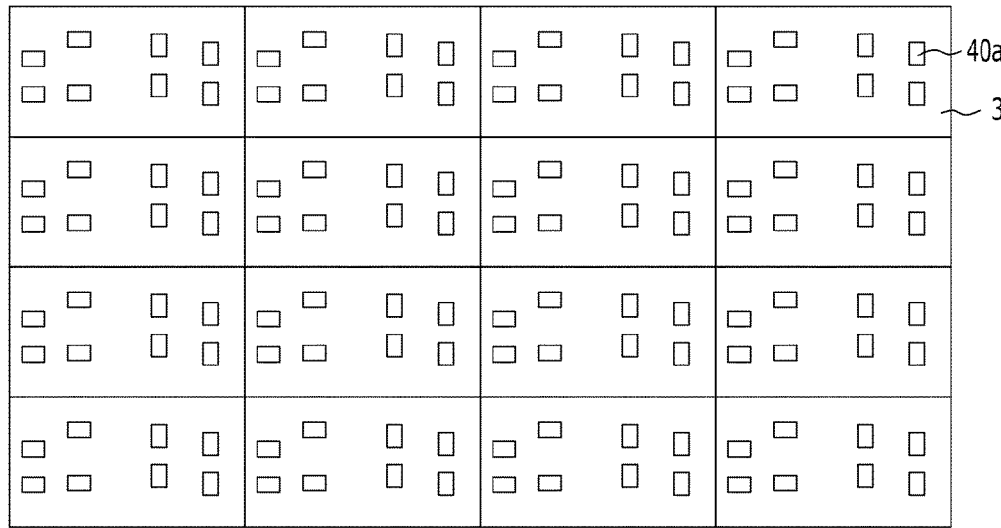
[FIG. 10B]

[FIG. 11]
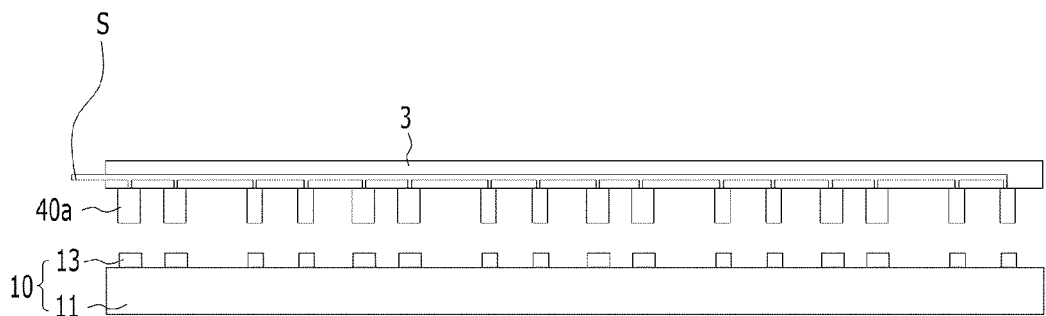

[FIG. 12]
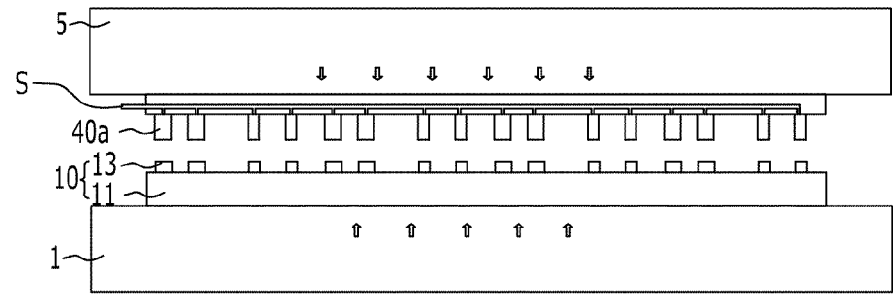
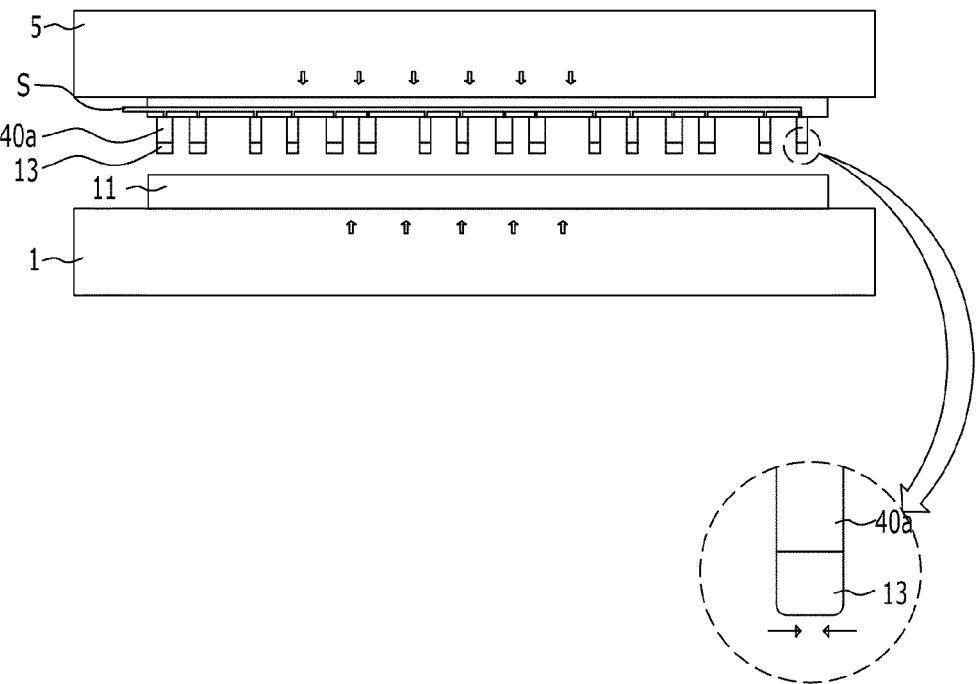

[FIG. 13]
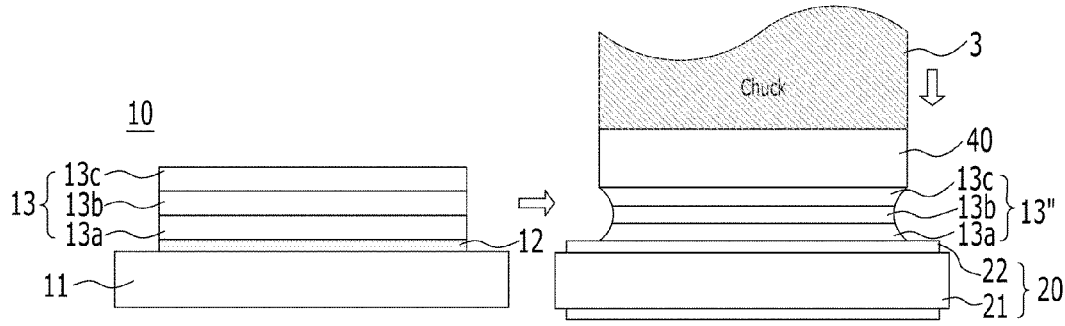
[FIG. 14]
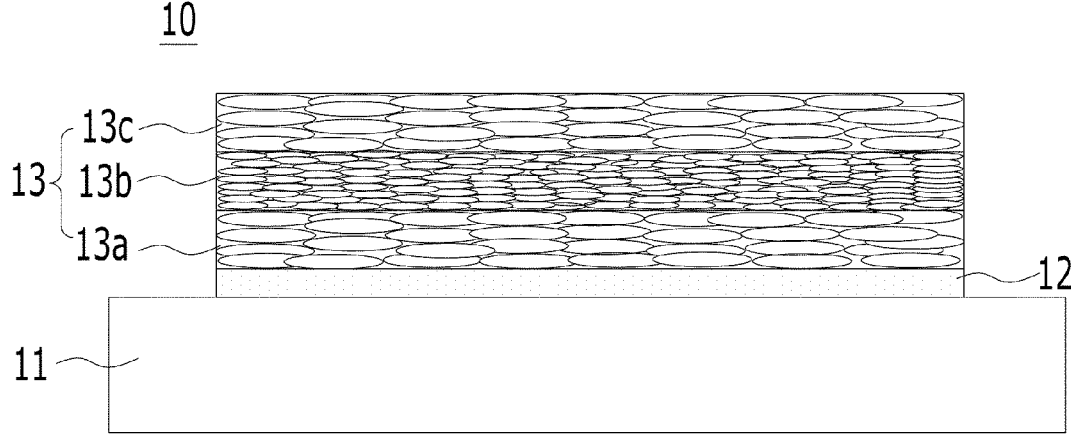

[FIG. 15]
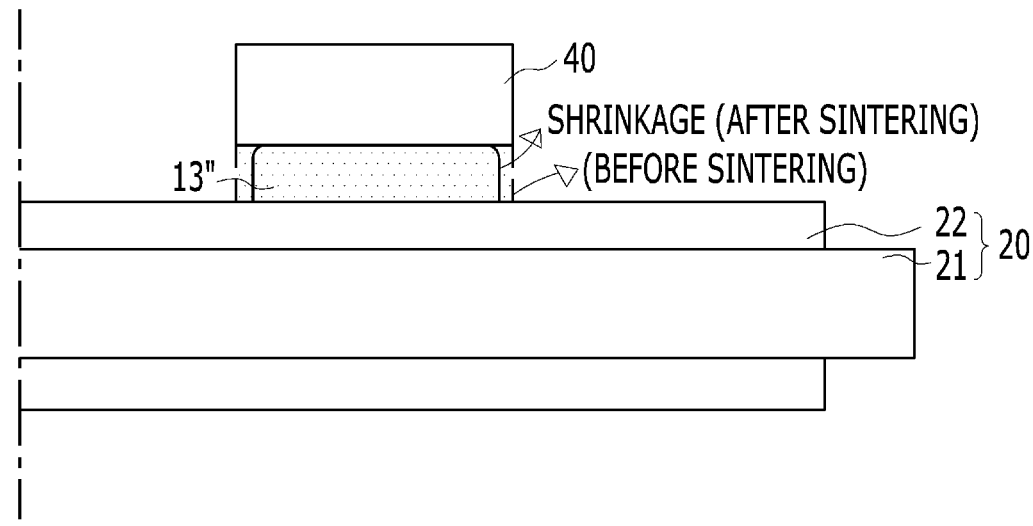
[FIG. 16]
Operating temperature of power semiconductor 150~250°C
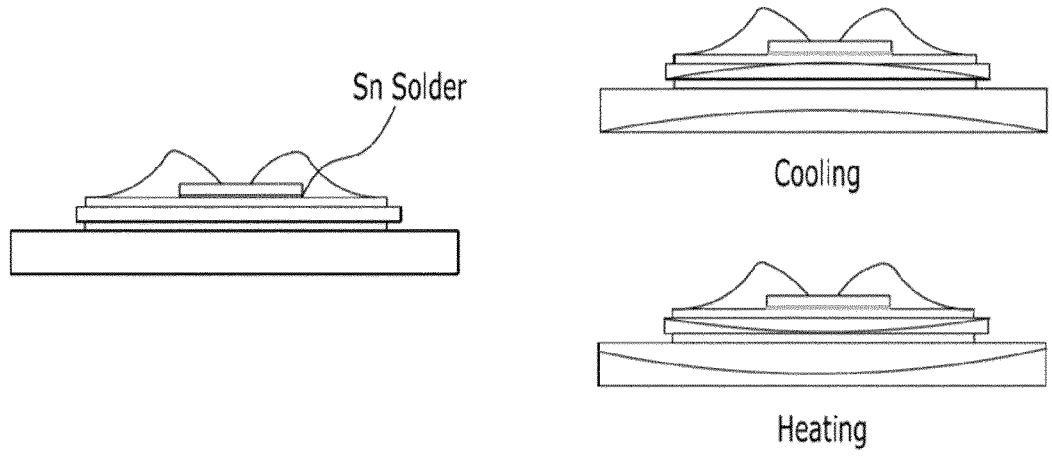

[FIG. 17A]
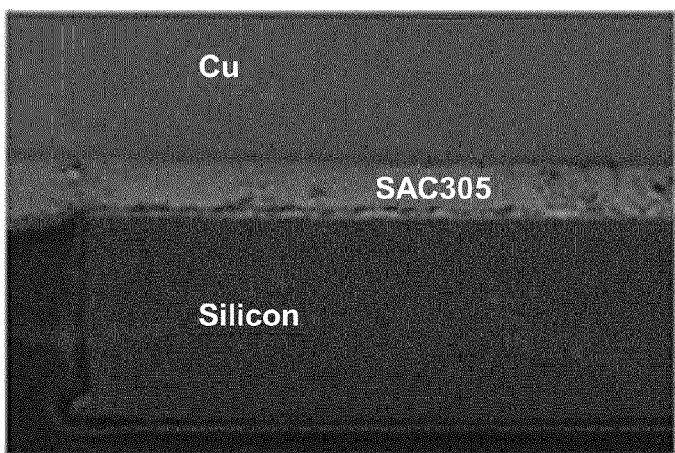
[FIG. 17B]
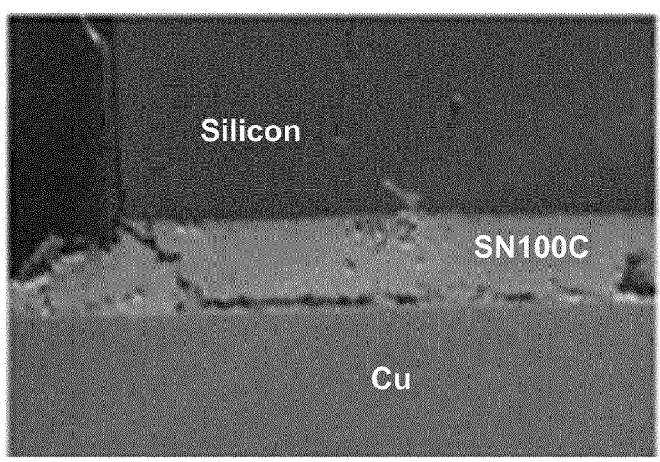

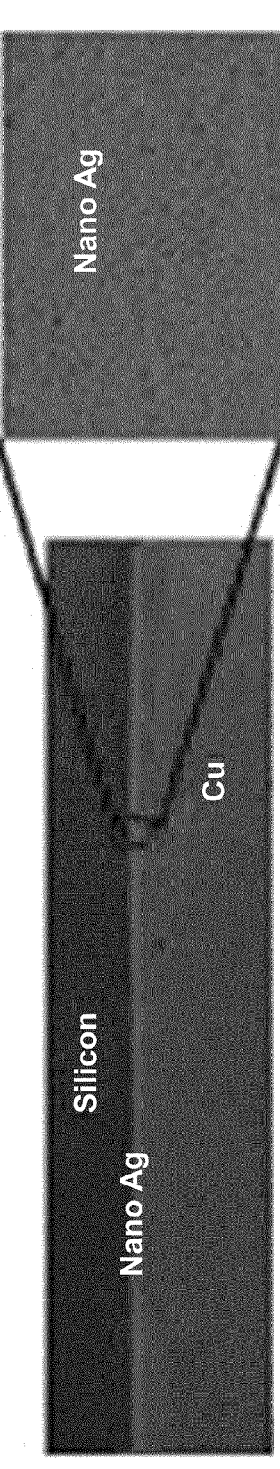
[FIG. 17C]

[FIG. 18A]
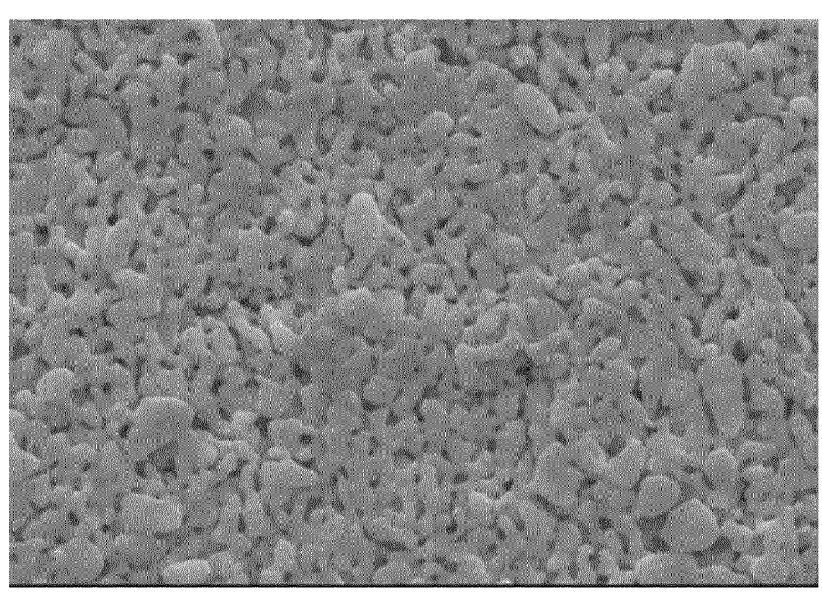
[FIG. 18B]
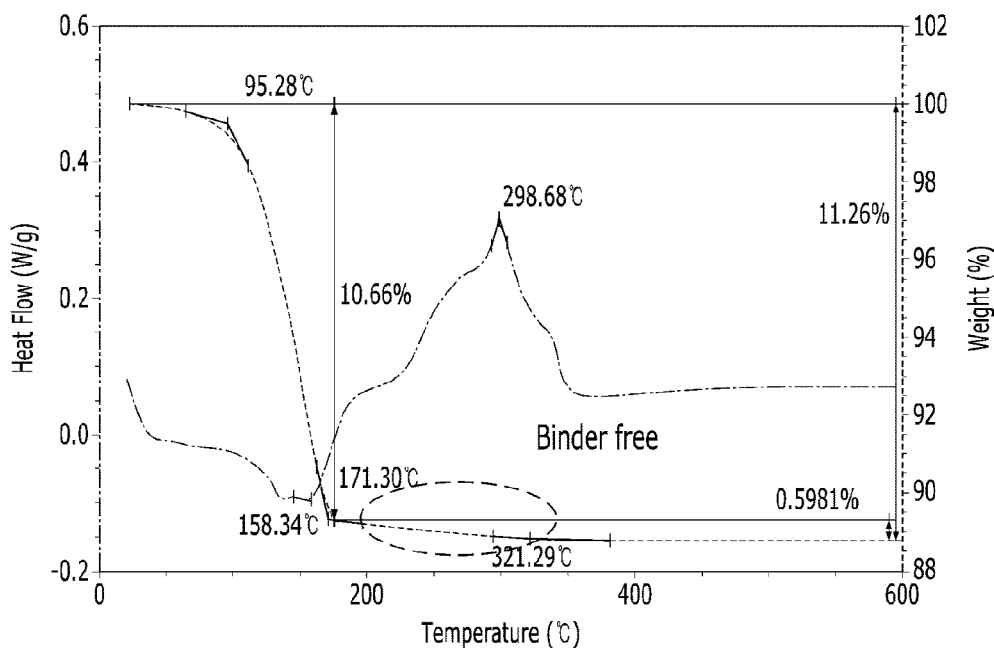

[FIG. 19A]
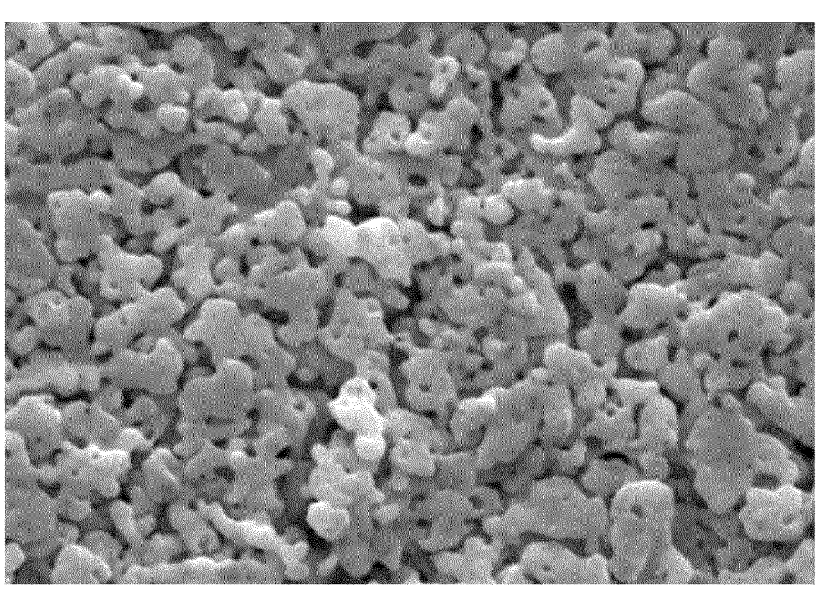
[FIG. 19B]
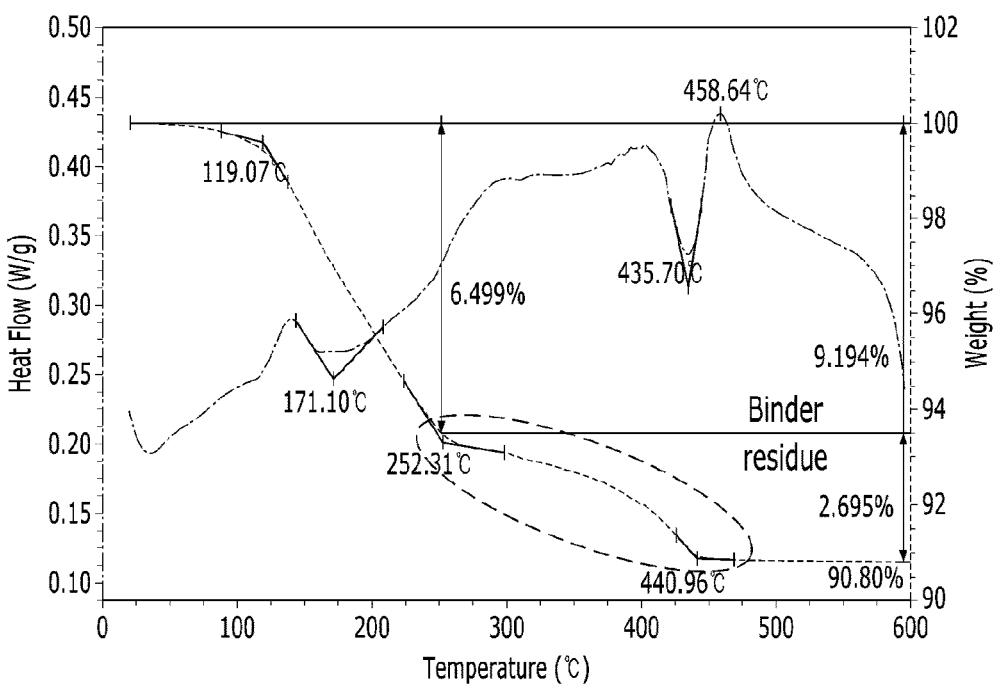

[FIG. 20A]
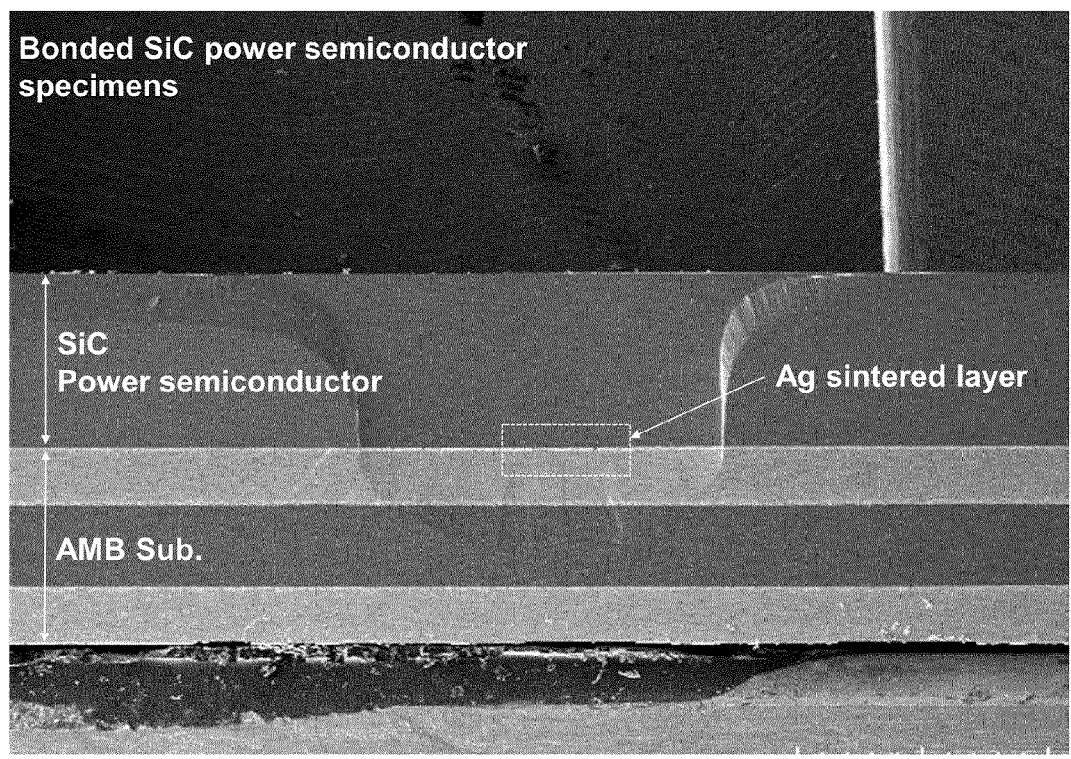

[FIG. 20B]
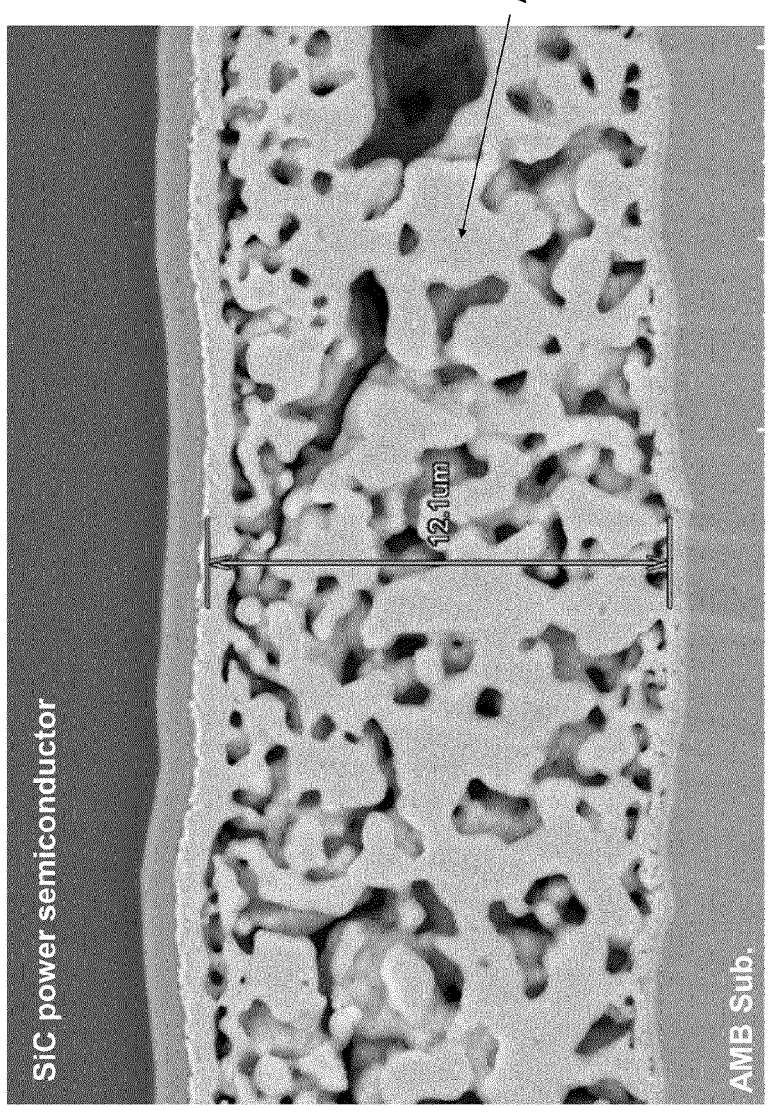

[FIG. 21A]
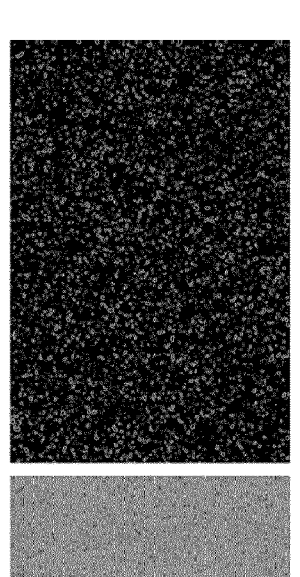
Porosity: 8.2%
56.25 μm
150μm Mask stencil Printing

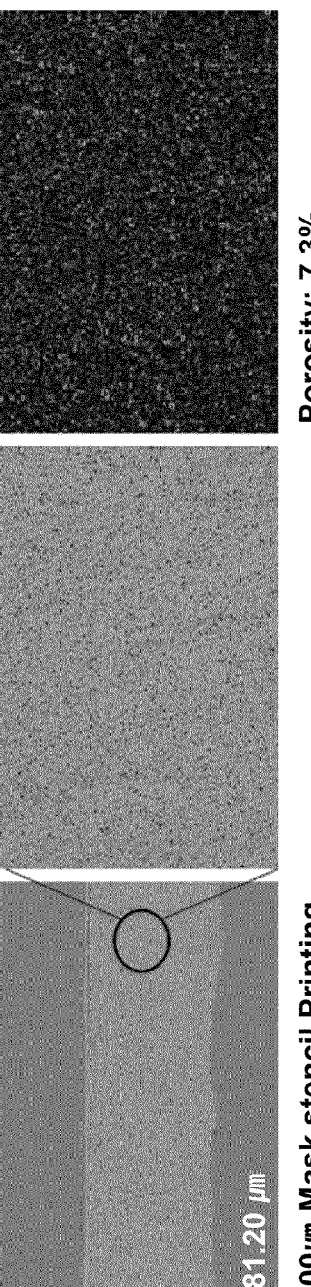
[FIG. 21B]

[FIG. 22]
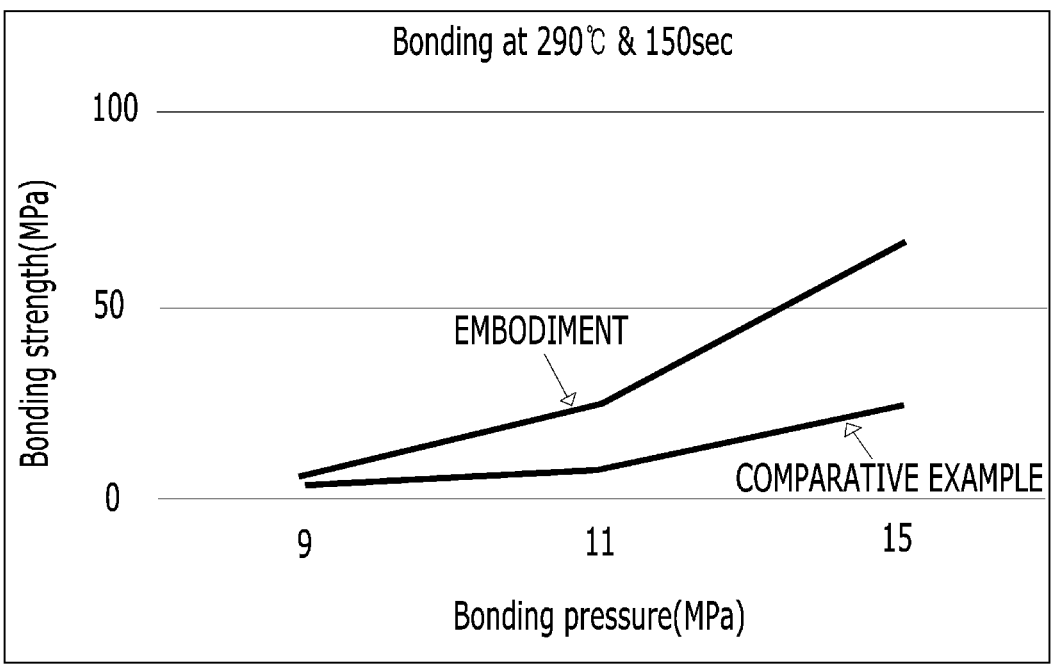
[FIG. 23]
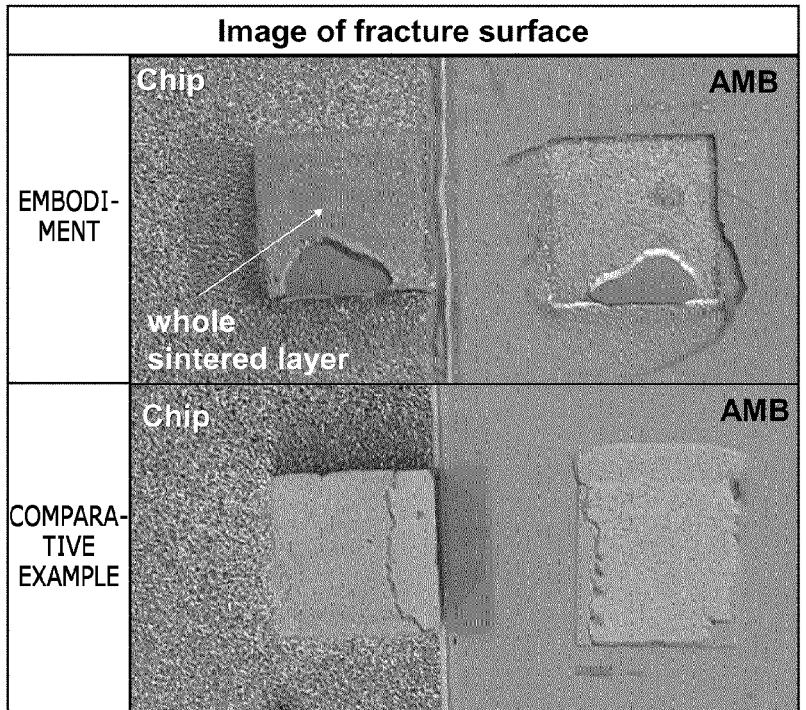

[FIG. 24]
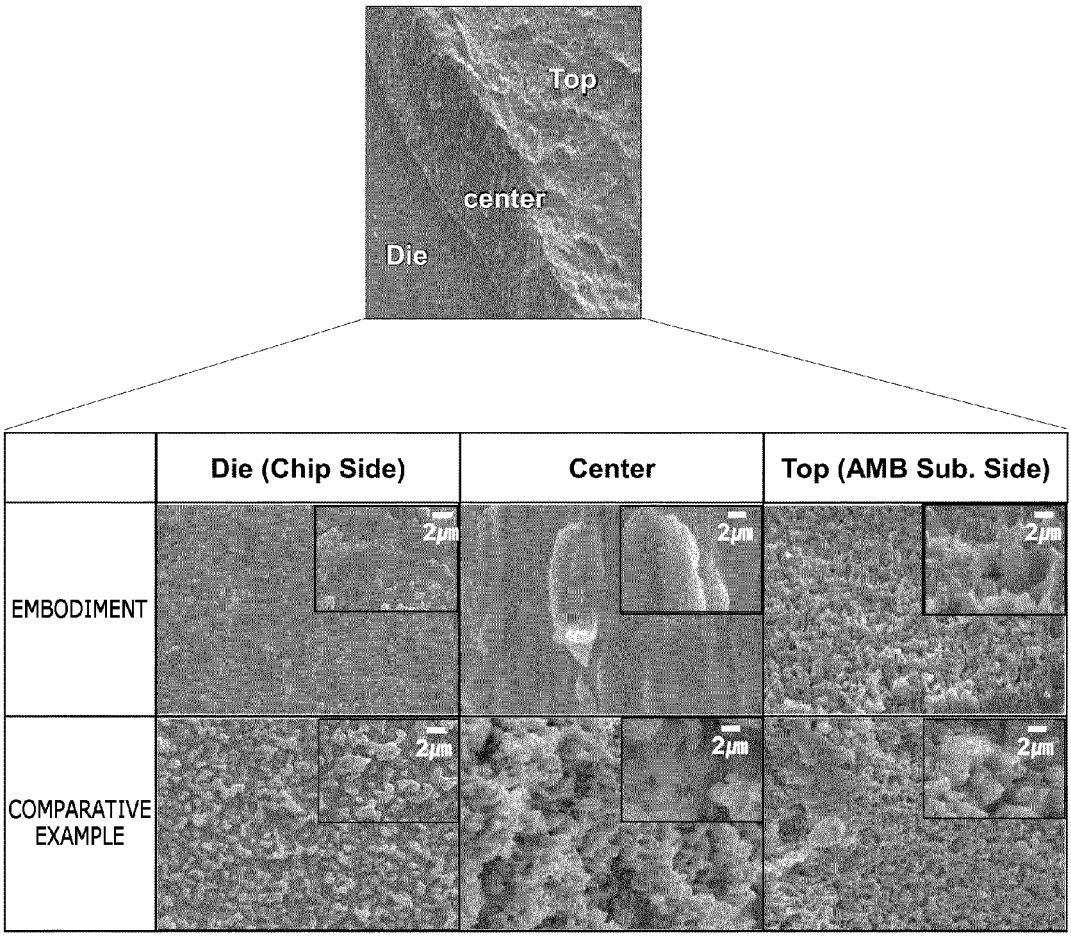

[FIG. 25]
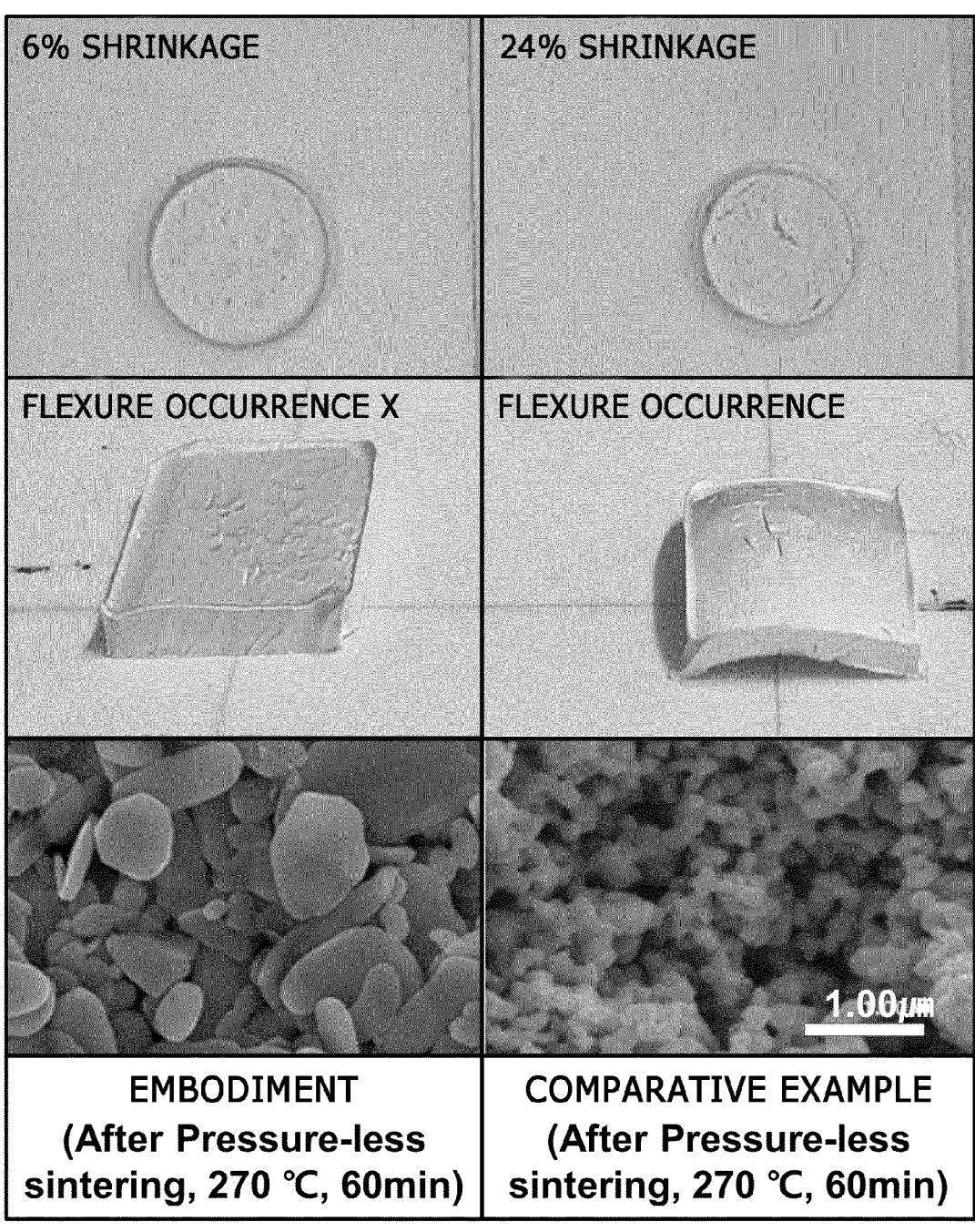

[FIG. 26]
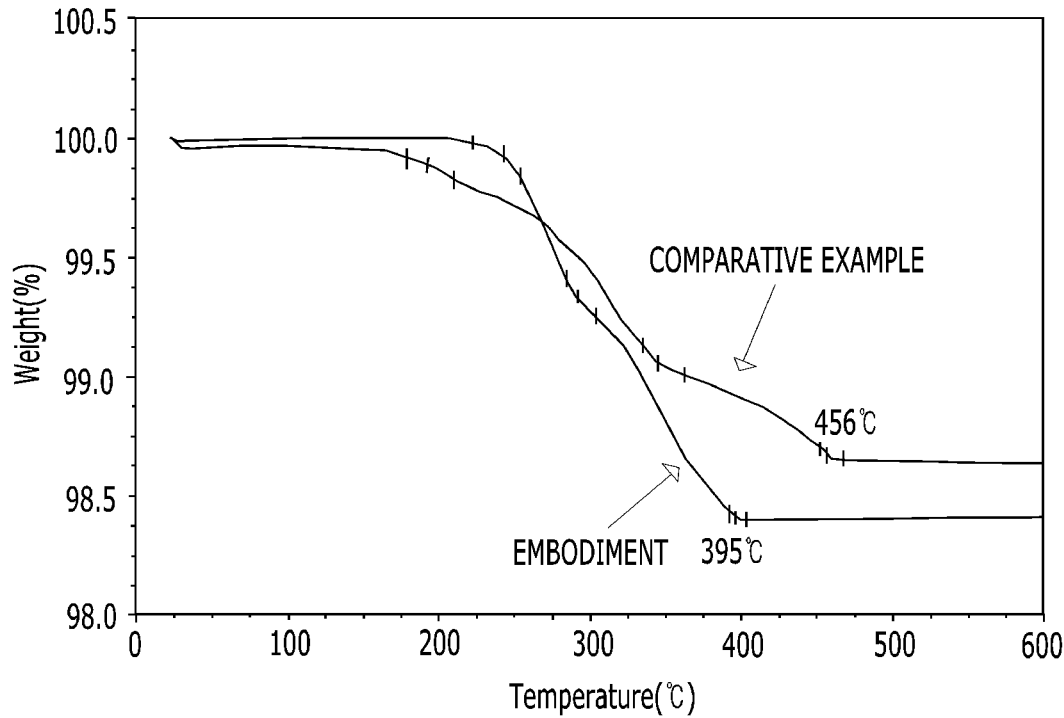

[FIG. 27]
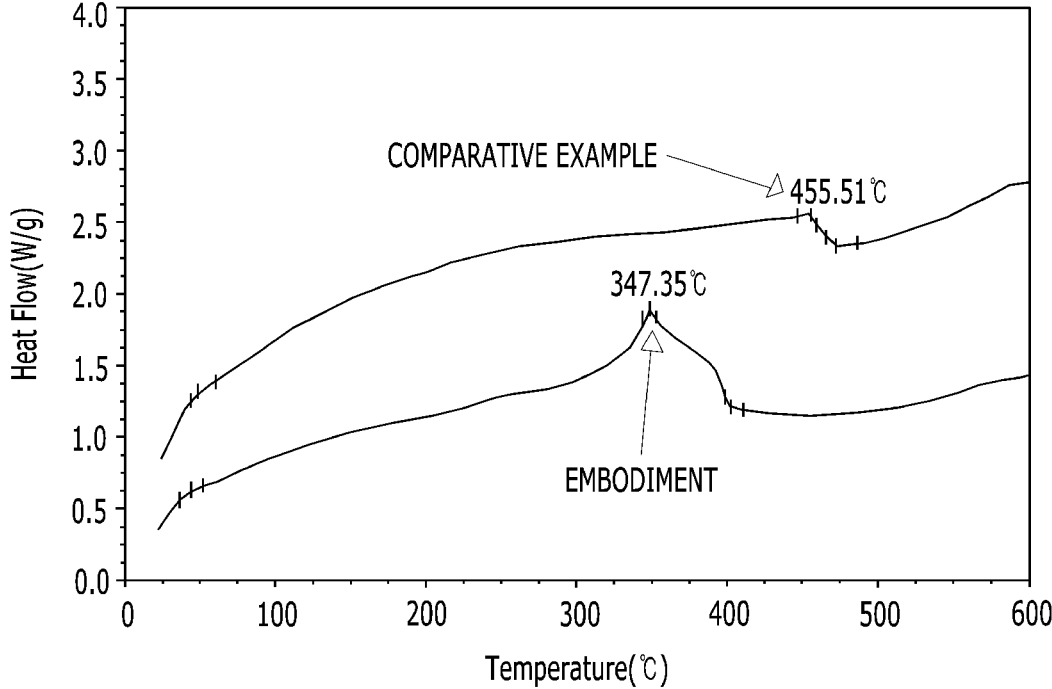

ADHESIVE TRANSFER FILM AND METHOD FOR MANUFACTURING POWER MODULE SUBSTRATE BY USING SAME

TECHNICAL FIELD

The present disclosure relates to an adhesive transfer film and a method for manufacturing a power module substrate by using the same, and more specifically, to an adhesive transfer film prepared for bonding a semiconductor chip and a spacer to a substrate and a method for manufacturing a power module substrate by using the same.

BACKGROUND ART

A power module changes the voltage used in an electric vehicle from DC to AC and supplies it to a motor. Due to the high performance of electric vehicles, a semiconductor chip mounted on the power module has been changed from conventional silicon (Si) to silicon carbide (SiC) with excellent performance. Thus, heat dissipation is important because a power module using a SiC semiconductor generates high heat due to high voltage.

The power module is manufactured by utilizing a bonding scheme using Ag sintering paste in order to allow a semiconductor chip to be mounted between two substrates and improve heat dissipation of the semiconductor chip. However, in the case of bonding using Ag sintering paste, it is difficult to uniformly apply Ag sintering paste to a semiconductor chip or a spacer. In addition, when the spacer is placed on the semiconductor chip, additional adhesive application and secondary sintering are required, so the process time is long and expensive equipment is required.

In addition, the power module may be manufactured by using a soldering bonding scheme to prevent the semiconductor chip from being damaged in bonding each component, but the soldering bonding scheme may be separated due to low bonding strength.

SUMMARY OF INVENTION

Technical Problem

One object of the present disclosure is to provide an adhesive transfer film which has a uniform thickness and can be bonded without a void by manufacturing Ag sintering paste in the form of a film, can reduce the process time by minimizing the sintering process, and can reduce the equipment investment cost in a bonding process for bonding a semiconductor chip and a spacer to a substrate, and a method for manufacturing a power module substrate by using the same.

Another object of the present disclosure is to provide an adhesive transfer film that is capable of reducing the frequency of occurrence of burrs in the bonding process and lowering the unit cost by fabricating an adhesive layer made of Ag sintering paste in the form of a pattern on a film, and a method for manufacturing a power module substrate by using the same.

Still another object of the present disclosure is to provide an adhesive transfer film that has high thermal conductivity and high fracture strength after sintering and can minimize defects due to cracks, and a method for manufacturing a power module substrate by using the same.

Solution to Problem

In order to achieve the objects, an adhesive transfer film according to an embodiment of the present disclosure includes a base film; a sticky layer formed on the base film; and an adhesive layer formed on the sticky layer.

The adhesive layer includes an Ag adhesive layer, and the Ag adhesive layer includes 97 to 99 wt % of Ag powder and 1 to 3 wt % of a binder.

The base film includes a PET film, and the sticky layer includes OCA.

The adhesive layer is formed in a pattern shape on the sticky layer.

In addition, the adhesive layer is formed in a multilayer structure on the sticky layer.

The adhesive layer includes a first adhesive layer laminated on an upper surface of the sticky layer; a second adhesive layer laminated on an upper surface of the first adhesive layer; and a third adhesive layer laminated on an upper surface of the second adhesive layer, wherein the first and third adhesive layers include Ag powder made of nanoparticles, the first to third adhesive layers include Ag powders made of flake form nanoparticles, and an average particle diameter of the Ag powder included in the second adhesive layer is relatively smaller than average particle diameters of the Ag powders included in the first adhesive layer and the third adhesive layer.

A method for manufacturing a power module substrate includes a preparing step of preparing an adhesive transfer film; a temporary bonding step of transferring an adhesive layer on the adhesive transfer film to an object, and temporarily bonding the object to which the adhesive layer is transferred to a lower substrate by medium of the adhesive layer; and a main bonding step of bonding an upper substrate to an upper portion of the object temporarily bonded on the lower substrate and performing sintering to main bond the object between the lower substrate and the upper substrate.

The preparing step includes preparing a base film; forming a sticky layer on the base film; and forming an adhesive layer on the sticky layer.

The preparing step includes attaching an OCA film on a PET film; and forming an Ag adhesive layer by applying or printing Ag sintering paste on the OCA film and drying the Ag sintering paste applied or printed on the OCA film.

The preparing step includes preparing the adhesive transfer film to form an adhesive layer having a pattern shape corresponding to a position of the object.

In addition, the preparing step includes attaching an OCA film on a PET film; and mesh screen printing or stencil printing Ag sintering paste on the OCA film, and drying to form an Ag adhesive layer having a pattern shape.

In addition, the preparing step includes preparing a base film; forming a sticky layer on the base film; and forming the adhesive layer having a multilayer structure by coating Ag sintering paste on the sticky layer and drying the Ag sintering paste coated on the sticky layer three times or more.

The temporary bonding step includes fixing the adhesive transfer film to a die and fixing the object to an upper chuck for adsorbing and fixing the object using a vacuum; transferring the adhesive layer on the adhesive transfer film to the object by pressing the object fixed to the upper chuck toward the adhesive transfer film while heating the upper chuck and the die, respectively; raising the object to which the adhesive layer is attached by raising the upper chuck while maintaining a vacuum; transferring the upper chuck to an upper portion of the lower substrate; temporarily bonding the object to the lower substrate by pressing the object fixed to the upper chuck toward the lower substrate; and releasing the vacuum and raising the upper chuck.

3

In the temporary bonding step, the die is heated to a temperature of 80 to 100° C., and the upper chuck is heated to a temperature of 100 to 170° C.

In the main bonding step, the sintering is performed for 2 to 5 minutes while heating and pressing at 240 to 300° C.

In the temporary bonding step, the object includes a semiconductor chip, a first conductive spacer and a second conductive spacer, and the temporary bonding step includes a first temporary bonding step of transferring the adhesive layer on the adhesive transfer film to a lower surface of the semiconductor chip, and temporarily bonding the semiconductor chip to which the adhesive layer is transferred to an upper surface of the lower substrate by medium of the adhesive layer; a second temporary bonding step of transferring the adhesive layer on the adhesive transfer film to a lower surface of the first conductive spacer, and temporarily bonding the first conductive spacer to which the adhesive layer is transferred to an upper surface of the semiconductor chip by medium of the adhesive layer; and a third temporary bonding step of transferring the adhesive layer on the adhesive transfer film to a lower surface of the second conductive spacer, and temporarily bonding the second conductive spacer to which the adhesive layer is transferred to an upper surface of the lower substrate by medium of the adhesive layer.

A height of the second conductive spacer is equal to a sum of heights of the semiconductor chip, the adhesive layer, and the first conductive spacer.

The main bonding step includes forming the adhesive layer on the lower surface of the upper substrate to be placed to correspond to the first conductive spacer and the second conductive spacer that are temporarily bonded on the lower substrate; and fixing the upper substrate to an upper chuck, and main bonding a temporary bonding body of the semiconductor chip and the first conductive spacer, and the second conductive spacer between the upper substrate and the lower substrate by heating and pressing the upper substrate fixed to the upper chuck toward the lower substrate.

An AMB substrate or a DBC substrate is used for the upper substrate and the lower substrate.

Advantageous Effects of Invention

According to the present disclosure, the silver sintering paste is manufactured in the form of a film and used for bonding the semiconductor chip and the spacer to the lower substrate. In addition, according to the present disclosure, the adhesive layer is formed on the final upper substrate in a printing scheme, and is sintered by heating and pressing while being bonded to the spacer of the lower substrate.

Therefore, according to the present disclosure, because it is possible to main bond the spacer on the lower substrate and the upper substrate without the need to turn over the lower substrate, the sintering may be simplified once, thereby reducing the process time and equipment investment cost.

In addition, according to the present disclosure, the base film may control the flatness of the lower surface of the adhesive layer for bonding the semiconductor chip and the spacer between the lower substrate and the upper substrate, and the flatness of the upper surface of the adhesive layer may be controlled by the pressing force of the upper chuck, so that the thickness of the adhesive layer is formed thinly and uniformly. Therefore, according to the present disclosure, it is possible to uniformly bond the upper substrate and the lower substrate, thereby contributing to improving the reliability of a power module product.

In addition, according to the present disclosure, mass production is possible by patterning the adhesive layer, and a plurality of objects such as semiconductor chips may be temporarily bonded to a substrate with one transfer, so that it is possible to reduce the amount of the adhesive transfer film used and greatly reduce the temporary bonding process time.

In addition, according to the present disclosure, because the patterned adhesive layer is transferred in one-to-one correspondence with the object, the burrs generated during transfer may be greatly reduced, and the area of the adhesive layer using Ag in the adhesive transfer film may be greatly reduced, thereby greatly reducing the product cost.

In addition, according to the present disclosure, the adhesive transfer film, in which an Ag adhesive layer having a multilayer structure is formed on the base film, may be prepared by coating the Ag sintering paste on the base film three times or more and drying it, and the adhesive transfer film may be used to bond a semiconductor chip and a spacer to a substrate.

The Ag adhesive layer having a multi-layer structure has a small shrinkage rate in sintering because the Ag powder particles have a flake form. In addition, because the Ag adhesive layer has a multi-layer structure and different powder particles, there is an advantage in removing residual stress, which is the initiation point of cracks, so that defects due to cracks after sintering may be minimized, and high breaking strength (tensile strength) of 50 MPa or more may be secured.

In addition, by minimizing pores when semiconductor chips and spacers are bonded to a substrate by applying a pressure sintering scheme, the above-described multi-layered Ag adhesive layer may secure high thermal conductivity and the sintering time may be reduced, thereby improving process efficiency.

BRIEF DESCRIPTION OF DRAWINGS

FIG. 1 is a cross-sectional view showing an adhesive transfer film according to a first embodiment of the present disclosure.

FIG. 2 is a view illustrating a method for manufacturing a power module substrate according to the first embodiment of the present disclosure.

FIG. 3 is a plan view illustrating an example of the power module substrate according to the first embodiment of the present disclosure.

FIGS. 4A to 4D show is a view illustrating a method for manufacturing the power module substrate of FIG. 3.

FIG. 5 is a plan view illustrating another example of the power module substrate according to the first embodiment of the present disclosure.

FIG. 6 is a view illustrating a method for manufacturing the power module substrate of FIG. 5.

Figure 7:
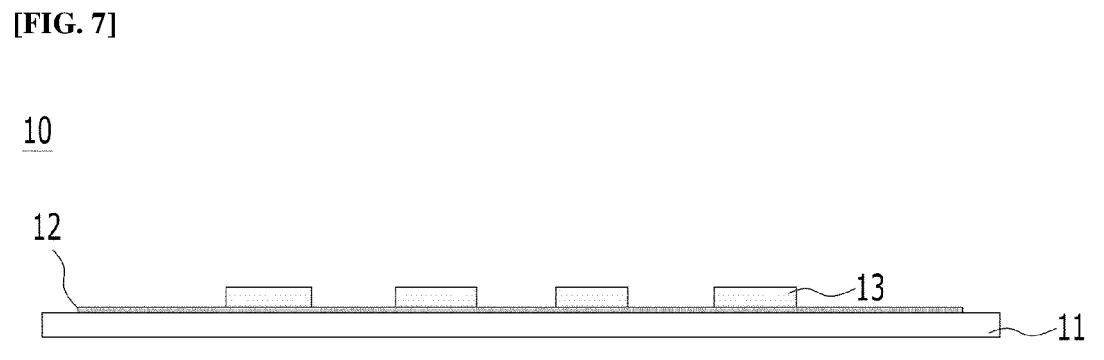

FIG. 7 is a cross-sectional view showing an adhesive transfer film according to a second embodiment of the present disclosure.

FIG. 8 is a view illustrating a method for manufacturing a power module substrate according to a second embodiment of the present disclosure.

FIGS. 9A to 9C show is a view illustrating an example of the method for manufacturing a power module substrate according to the second embodiment of the present disclosure.

FIGS. 10A to 10B show a bottom view of an upper chuck to which the semiconductor chip is fixed, and a plan view of an adhesive transfer film corresponding thereto.

FIG. 11 is a cross-sectional view of FIG. 10.

FIG. 12 is a view illustrating a method for manufacturing a power module substrate by using the upper chuck and the adhesive transfer film shown in FIGS. 10 and 11.

FIG. 13 is a cross-sectional view illustrating sintered states of an adhesive layer structure and an adhesive layer of an adhesive transfer film according to a third embodiment of the present disclosure.

FIG. 14 is a cross-sectional view illustrating the microstructure of the adhesive layer of the adhesive transfer film according to the third embodiment of the present disclosure.

FIG. 15 is a view illustrating a shrinkage state after sintering of the adhesive layer bonding an object to a substrate in the adhesive transfer film according to the third embodiment of the present disclosure.

FIG. 16 is a view illustrating a flexure that occurs while repeating cooling and heating in a semiconductor chip of a power module.

FIGS. 17A to 17C to show an SEM photograph comparing crack characteristics by applying an Ag adhesive layer (third embodiment) according to an embodiment of the present disclosure and Sn solder (comparative example) to a power module.

FIGS. 18A to 18B are an SEM photograph and graph illustrating a microstructure according to the binder content of the Ag adhesive layer (third embodiment) of the present disclosure.

FIGS. 19A to 19B are an SEM photograph and graph illustrating a microstructure according to the binder content of Sn solder (comparative example).

FIGS. 20A to 20B are an SEM photograph showing the microstructure of the Ag adhesive layer (third embodiment) of the present disclosure, which is sintered at 250° C. for 30 minutes without pressing.

FIGS. 21A to 21B are a photograph of the structure of the Ag adhesive layer (Ag sintered layer) sintered after press-sintering the Si semiconductor chip to which the Ag adhesive layer (third embodiment) of the present disclosure is transferred on a substrate.

FIG. 22 is a graph comparing the adhesive strength of the Ag adhesive layer (third embodiment) of the present disclosure with that of a competitor product (comparative Example).

FIG. 23 is a general photograph of the fracture surfaces of the embodiment and the comparative example of FIG. 22.

FIG. 24 is a SEM photograph of the fracture surfaces of the embodiment and the comparative example of FIG. 22.

FIG. 25 is a photograph comparing the shrinkage ratio, flexure occurrence, and microstructure of the Ag adhesive layer of the embodiment (third embodiment) and those of the comparative example (manufactured by another company).

FIG. 26 is a graph comparing the weight loss of the Ag adhesive layer according to the third embodiment of the present disclosure and the comparative example (manufactured by another company).

FIG. 27 is a graph of measured calories of the Ag adhesive layer according to the third embodiment of the present disclosure and the comparative example (manufactured by another company).

DESCRIPTION OF EMBODIMENTS

Hereinafter, embodiments of the present disclosure will be described in detail with reference to the accompanying drawings.

An adhesive transfer film 10 according to the first embodiment of the present disclosure may be used for bonding an object such as a power semiconductor chip, a conductive spacer (CQC), an insulating spacer to a substrate.

As shown in FIG. 1, the adhesive transfer film 10 according to the first embodiment of the present disclosure includes a base film 11, a sticky layer 12 formed on the base film 11, and an adhesive layer 13 formed on the sticky layer 12. The adhesive transfer film 10 is fabricated of an Ag sintering paste in the form of a film. A PET film is applied for the base film 11, an OCA film is applied for the sticky layer 12, and an Ag adhesive layer is applied for the adhesive layer 13. The Ag adhesive layer 13 is used for good heat dissipation properties.

The Ag adhesive layer includes 98 to 99 wt % of Ag powder and 1 to 2 wt % of a binder. The content of Ag powder in the Ag adhesive layer is increased to increase thermal conductivity.

Ag has good heat dissipation properties with high thermal conductivity, and allows the adhesive layer to have conductivity. The binder allows Ag to have high adhesion and to be uniformly applied. The Ag adhesive layer enables low-temperature sintering by maximizing the content of Ag powder and minimizing the content of the binder in the uniformly applicable range. The low-temperature sintering temperature may be in the range of 240 to 300° C.

When the content of the binder is lowered to 1 to 2 wt %, the organic content is lowered, so that the thermal decomposition and sintering temperature of the Ag adhesive layer may be lowered by about 60 to 100° C. The low sintering temperature enables fast sintering of the Ag adhesive layer. The rapid sintering of the Ag adhesive layer reduces the shrinkage rate during sintering and prevents cracking of the sintered layer, thereby lowering the defect rate.

The Ag adhesive layer contains Ag powder in the form of nanoparticles. Since Ag powder has a liquid phase temperature of 900° C. or higher, sintering is possible in a range of 240 to 300° C., and Ag solder cannot be sintered in a range of 240 to 300° C. because the liquid phase temperature is 200° C. or higher. Therefore, the Ag adhesive layer needs to contain Ag powder, not Ag solder, in the form of nanoparticles.

The Ag adhesive layer has a high thermal conductivity of 200 to 300 W/mK, a shear strength of 50 MPa or more, and a viscosity of 40 to 100 kcps, which has high adhesion on various surfaces. It is possible to use Au instead of Ag, but it is preferable to use Ag in terms of cost.

The adhesive transfer film 10 may be formed by attaching an OCA film on the base film 11, applying or printing Ag sintering paste on the OCA film, and drying it. Alternatively, the adhesive transfer film 10 may be formed by applying or printing Ag sintering paste on the base film 11 and drying it. The printing may be screen printing or stencil printing.

The sticky layer 12 improves the releasability of the adhesive layer 13 to the base film 11. The Ag sintering paste contains 97 to 99 wt % of Ag powder and 1 to 3 wt % of the binder in the same manner as the Ag adhesive layer.

The adhesive transfer film 10 prepared in the form of a film may make the height of the adhesive layer 13 very uniform. When bonding an object between two substrates, the height of the adhesive layer 13 must be uniform such that a tolerance does not occur between the two substrates and any problems do not occur in the final product.

In addition, when the adhesive transfer film 10 is used in bonding an object between two substrates, it is possible to reduce a void and stand-off defects compared to a conventional paste process of applying a paste to an object and bonding it to a substrate. The void means that pores are generated in the adhesive layer 13 after sintering, and the stand-off defect means that an object is inclined to one side without being flatly bonded to the substrate.

The adhesive transfer film 10 may have a thickness of 75-100 μm of the base film 11. The thickness of the adhesive layer 13 may be 40 to 60 μm, preferably 50 μm. The adhesive transfer film 10 may control the thickness and voids of the adhesive layer 13.

The adhesive transfer film 10 may be applied to a method for manufacturing a power module substrate.

As shown in FIG. 2, a method for manufacturing a power module substrate by using the adhesive transfer film 10 according to the first embodiment of the present disclosure may include transferring an adhesive layer to an object 40 by using the adhesive transfer film 10, and temporarily bonding the object 40 to which the adhesive layer 13 has been transferred to an upper surface of a lower substrate 20.

A method for manufacturing a power module substrate includes a preparing step of preparing the adhesive transfer film 10, a temporary bonding step of transferring an adhesive layer on the adhesive transfer film to an object, and temporarily bonding the object to which the adhesive layer has been transferred to a lower substrate by a medium of the adhesive layer, and a main bonding step of bonding the upper substrate 30 to an upper portion of the object 40 temporarily bonded on the lower substrate 20 and performing sintering to bond the object 40 between the lower substrate and the upper substrate 30.

The preparation step is a step of pre-coating an adhesive layer on the base film.

The preparing step includes preparing the base film 11, forming the sticky layer 12 on the base film 11 and forming the adhesive layer 13 on the sticky layer 12. As an example, the preparing step includes attaching an OCA film on a PET film, and applying or printing an Ag sintering paste on the OCA film, and drying it to form the Ag adhesive layer. As the base film 11, a polycarbonate (PC) film may be used in addition to a polyester (PET) film. However, compared to the PC film, the PET film is advantageous in maintaining the flatness of the lower surface of the adhesive layer 13. The flatness of the upper surface of the adhesive layer 13 may be controlled by the pressing force of the upper chuck 3. When the flatness of the adhesive layer 13 is not good, the adhesive layer is bent during sintering.

As shown in FIG. 2, the temporary bonding step includes step s1 of fixing the adhesive transfer film 10 to a die 1 and fixing the object 40 to an upper chuck 3 for adsorbing and fixing the object 40 by using a vacuum, step s2 of transferring the adhesive layer 13 on the adhesive transfer film 10 to the object 40 by pressing the object 40 fixed to the upper chuck 3 toward the adhesive transfer film 10 while heating the upper chuck 3 and the die 1, respectively, step s3 of raising the object 40 to which the adhesive layer 13 is attached by raising the upper chuck 3 while maintaining a vacuum, step s4 of transferring the upper chuck 3 to an upper portion of the lower substrate 20, step s5 of temporarily bonding the object 40 to the lower substrate 20 by pressing the object 40 fixed to the upper chuck 3 toward the lower substrate 20, and step s6 of releasing the vacuum of the upper chuck 3 and raising the upper chuck 3. The steps s1 to s3 are steps of transferring the adhesive layer 13 from the adhesive transfer film 10 to the object 40, and the steps s5 and s6 are steps in which the object 40 to which the adhesive layer 13 is transferred temporarily bonded to the lower substrate 20.

In the step s1, the upper chuck 3 picks up the object 40 in a vacuum.

In the step s2, the adhesive layer 13 is transferred to the lower surface of the object 40. In the step s2, the die 1 is heated to a temperature of 80 to 100° C. and the upper chuck 3 is heated to a temperature of 100 to 170° C. Preferably, the die is heated to a temperature of 80 to 100° C., and the upper chuck 3 is heated to a temperature of 160° C. Pressurization may be performed at 1 to 4 MPa. When the heating temperature of the upper chuck 3 is higher than the heating temperature of the die 1, the adhesive layer 13 may be strongly adhered to the object 40 having a higher temperature.

In the step s3, the adhesive layer 13 is picked up while being attached to the object. In the step s3, the adhesive layer 13 is attached to the lower surface of the object 40 by transfer and is separated from the base film 11. In this case, since the sticky layer 12 is not separated from the base film 11, the adhesive layer 13 may be separated cleanly.

In the step s4, the object 40 is transferred to the upper portion of the lower substrate 20 to temporarily bond the object 40 on the lower substrate 20. The lower substrate 20 may be an AMB substrate or a DBC substrate.

In the step s5, the object 40 is temporarily bonded on the lower substrate 20 by pressing the object 40 fixed to the upper chuck 3 toward the lower substrate 20. In the step s5, the die 1 is heated to a temperature of 80 to 100° C. and the upper chuck 3 is heated to a temperature of 100 to 170° C. Preferably, the die 1 is heated to a temperature of 80 to 100° C., and the upper chuck 3 is heated to a temperature of 160° C. Pressurization may be performed in the range of 1 to 4 MPa.

In the step s6, the temporary bonding is completed by releasing the vacuum and raising the upper chuck 3. As described above, the adhesive transfer film 10 is heated using the die 1 heated to a temperature of 80 to 100° C., and the object 40 is heated using the upper chuck 3 heated to a temperature of 100 to 170° C. Then, when the upper chuck 3 is lowered to allow the object 40 to be pressed toward the adhesive transfer film 10, the adhesive layer 13 on the adhesive transfer film 10 may be transferred to the lower surface of the object 40 having a higher temperature.

After the temporary bonding step, performed is a step of main bonding the object 40 between the lower substrate 20 and the upper substrate 30 by bonding and sintering the upper substrate (refer to reference numeral 30 in FIG. 4) to the upper portion of the object 40 temporarily bonded on the lower substrate 20. The sintering may be performed for 2 to 5 minutes while heating and pressing at 240 to 300° C. The pressing may be performed in the range of 8 to 15 MPa.

The pressing is to prevent void from being generated. The pressing increases the density to significantly reduce the sintering process time. Therefore, when the pressing and sintering are performed, the adhesive layer 13 is dense without holes, so that the heat conduction is increased and the heat dissipation property is excellent. In addition, the pressing enables fast sintering.

The sintering temperature and time during the main bonding may be adjusted within the above-described range to shorten the mass production time. For example, for sintering during main bonding, it is preferable to perform pressing at 250° C. for 5 minutes, but the pressing may be performed at 300° C. for 2 minutes to improve mass productivity. The sintering is intended to improve bonding strength. The flatness of the adhesive layer 13 is secured by performing the pressing with a uniform pressure.

The temporary bonding step and the main bonding step may be performed respectively or may be performed simultaneously. The simultaneous execution means that the temporary bonding step may be omitted and the main bonding step may be performed. For example, in the step s5, the object 40 fixed to the upper chuck 3 is heated and pressed toward the substrate 20 at a temperature of 240 to 300° C. and a pressure of 8 to 15 MPa for 2 to 5 minutes to main bond the object 40 to the substrate 20 without the temporary bonding.

FIG. 3 illustrates an example of a power module substrate according to the first embodiment of the present disclosure.

The power module has a multi-layer structure of the lower substrate 20 and the upper substrate 30, and a semiconductor chip 40a is interposed between the lower substrate 20 and the upper substrate 30. The semiconductor chip includes a power semiconductor chip such as Si, SiC, or GaN.

The lower substrate 20 and the upper substrate 30 include ceramic substrates each including a ceramic substrate 21 and a metal substrate 22 brazed to at least one surface of the ceramic substrate 21 to increase the heat dissipation efficiency of the heat generated from the semiconductor chip 40a. The ceramic substrate 21 may be, for example, one of $Al_2O_3$, AlN, SiN and $Si_3N_4$. The metal layer 22 includes an electrode pattern for mounting the semiconductor chip 40a and an electrode pattern for mounting a driving element as a metal foil brazed on the ceramic substrate 21, respectively. As an example, the metal foil may be an aluminum foil or a copper foil. As an example, the metal foil is fired at 780 to 1100° C. on a ceramic substrate to be brazed to the ceramic substrate. In the embodiment, an AMB substrate or a DBC substrate is described as an example, but a TPC substrate or a DBA substrate may be applied. However, in terms of durability and heat dissipation efficiency, AMB substrates are most suitable.

A semiconductor chip 40a, a first conductive spacer 40b and a second conductive spacer 40c transfer the adhesive layer 13 on the adhesive transfer film 10, and are bonded between the 20 and the upper substrate 30 by using the adhesive layer 13. The adhesive layer 13 is an Ag adhesive layer having high heat dissipation.

An insulating spacer (refer to reference numeral 40d in FIG. 5) is used to maintain a gap between the lower substrate 20 and the upper substrate 30 when using a substrate having an upper and lower multilayer structure, and when electricity needs to pass between the lower substrate 20 and the upper substrate 30, conductive spacers 40b and 40c are used. In this case, the Ag adhesive layer having high heat dissipation is used to prevent heat generated in the semiconductor chip 40a from being diffused to the upper substrate 30 through the lower substrate 20.

In FIG. 3, one second conductive spacer 40c is located in the center of the lower substrate 20, and four first conductive spacers 40b are spaced apart from each other around the second conductive spacer 40c. The first conductive spacer 40b is bonded to the upper surface of the semiconductor chip 40a and is bonded to the upper substrate 30. In the method for manufacturing a power module substrate according to the first embodiment of the present disclosure, the semiconductor chip 40a and the first conductive spacer 40b are laminated bonded between the lower substrate 20 and the upper substrate 30. In addition. the second conductive spacer 40c may be bonded between the lower substrate 20 and the upper substrate 30 to have the same height as the sum of the heights of the semiconductor chip 40a and the first conductive spacer 40b, thereby obtaining heat dissipation characteristics and electrical conductivity.

FIGS. 4A to 4D illustrate example of the method for manufacturing a power module substrate according to the first embodiment of the present disclosure, which includes temporarily bonding a semiconductor chip, a first conductive spacer, and a second conductive spacer to the lower substrate of FIG. 3, and bonding and sintering the upper substrate thereon.

As illustrated in FIGS. 4A to 4C, a method for manufacturing a power module substrate includes a first temporary bonding step s10 of transferring the adhesive layer 13 on the adhesive transfer film 10 to a lower surface of the semiconductor chip 40a, and temporarily bonding the semiconductor chip 40a to which the adhesive layer 13 is transferred to an upper surface of the lower substrate 20 by medium of the adhesive layer 13, a second temporary bonding step s20 of transferring the adhesive layer 13 on the adhesive transfer film 10 to a lower surface of the first conductive spacer 40b, and temporarily bonding the first conductive spacer 40b to which the adhesive layer 13 is transferred to an upper surface of the semiconductor chip 40a by medium of the adhesive layer 13, and a third temporary bonding step s30 of transferring the adhesive layer 13 on the adhesive transfer film 10 to a lower surface of the second conductive spacer 40c, and temporarily bonding the second conductive spacer 40c to which the adhesive layer 13 is transferred to an upper surface of the lower substrate 20 by medium of the adhesive layer 13.

In the first temporary bonding step s10, the semiconductor chip 40a is a power semiconductor chip such as Si, SiC, or GaN.

In the second bonding step s20, the first conductive spacer 40b is an interconnection spacer (CQC). In addition, in the third temporary bonding step S30, the second conductive spacer 40c is an interconnection spacer (CQC). The interconnection spacer CQC is used when electricity needs to pass between the lower substrate 20 and the upper substrate 30. The interconnection spacer (CQC) may be formed in the form of a conductive metal block or in the form of a block in which a conductive metal is coated on the outer surface of an injection-molded product. The height of the second conductive spacer 40c is the same as the sum of the heights of the semiconductor chip 40a, the adhesive layer 13, and the first conductive spacer 40b.

The lower substrate 20 may be an AMB substrate or a DBC substrate. In the first to third temporary bonding steps, the upper chuck 3 fixes the semiconductor chip 40a, the first conductive spacer 40b, and the second conductive spacer 40c to the upper chuck 3 by vacuum suction.

In the first to third temporary bonding steps s10 to s30, the heating and pressing by the upper chuck 3 are performed for about 20 seconds at a temperature of 100 to 170° C. and a pressure of 1 to 4 MPa. In this case, the die 1 is heated and maintained at a temperature of 80 to 100° C.

After the third temporary bonding step s30, performed is the main bonding step of bonding and sintering the upper substrate 30 to the upper portions of the first conductive spacer 40b and the second conductive spacer 40c temporarily bonded to the lower substrate 20, thereby main bonding the semiconductor chip 40a, the first conductive spacer 40b, and the second conductive spacer 40c between the lower substrate 20 and the upper substrate 30.

As shown in FIG. 4D, the main bonding step includes step s40 of forming the adhesive layer 13 on the lower surface of the upper substrate 30 to be placed to correspond to the first conductive spacer 40b and the second conductive spacer 40c that are temporarily bonded on the lower substrate 20, and step s50 of fixing the upper substrate 30 to an upper chuck 3, and main bonding a temporary bonding body 40' of the semiconductor chip 40*a* and the first conductive spacer 40*b*, and the second conductive spacer 40*c* between the upper substrate 30 and the lower substrate 20 by heating and pressing the upper substrate 30 fixed to the upper chuck 3 toward the lower substrate 20. In the main bonding step, the heating and pressing are performed for 2 to 5 minutes at a temperature of 240 to 300° C. and a pressure of 8 to 15 MPa.

The adhesive layer 13 of the temporary bonding step becomes a sintered adhesive layer 13' after performing the main bonding step. Because the sintered adhesive layer 13' is dense without voids by pressing and sintering, the bonding strength is improved and the sintered adhesive layer 13' functions as an excellent heat dissipation electrode.

FIG. 5 illustrates another example of the power module substrate according to the first embodiment of the present disclosure.

The power module substrate shown in FIG. 5 includes the lower substrate 20, two second conductive spacers 40*c* located in the center of the lower substrate 20, and four first conductive spacers 40*b* disposed on both sides of the second conductive spacer 40*c*, respectively and bonded to a semiconductor chip 40*a*. In addition, four insulating spacers 40*d* are located at the corners of the lower substrate 20.

The first conductive spacer 40*b* and the second conductive spacer 40*c* are interconnection spacers (CQC), and the insulating spacer 40*d* forms a heat dissipation space between the lower substrate 20 and the upper substrate 30. The insulating spacer 40*d* may be formed of a ceramic material. The first conductive spacer 40*b* and the second conductive spacer 40*c* perform three functions of heat dissipation and electrical conduction. The insulating spacer 40*d* forms a space between the two substrates to perform a heat dissipation function.

In the case of the power module substrate shown in FIG. 5, the semiconductor chip 40*a*, the first conductive spacer 40*b*, and the second conductive spacer 40*c* and the insulating spacer 40*d* may be bonded to the lower substrate 20 at a uniform height through the processes shown in FIG. 4.

A method for manufacturing a power module substrate illustrated in FIG. 6 includes a temporary bonding step s100 of temporarily bonding the semiconductor chip 40*a*, the first conductive spacer 40*b*, the second conductive spacer 40*c* and the insulating spacer 40*d*, to which the adhesive layer 13 on the adhesive transfer film is transferred, to the lower substrate 20 by medium of the adhesive layer 13, and a main bonding step s200 of main bonding the semiconductor chip 40*a*, the first conductive spacer 40*b*, the second conductive spacer 40*c*, and the insulating spacer 40*d* onto the lower substrate 20 by sintering the semiconductor chip 40*a*, the first conductive spacer 40*b*, the second conductive spacer 40*c*, and the insulating spacer 40*d*, 20 which are in a temporarily bonding state, on the lower substrate.

In the temporary bonding step s100, the die 1 on which lower substrate 20 is placed may be heated to 80 to 100° C., and the upper chuck for temporarily bonding each object 40 to the lower substrate 20 may be heated to a temperature of 100 to 170° C.

In the main bonding step s200, the die 1' on which lower substrate 20 is placed may be heated to 240 to 300° C., and a heating and pressurizing press 5 for main bonding each object 40 to the lower substrate 20 may perform pressing at a pressure of 8 to 15 MPa while heating to a temperature of 240 to 300° C.

Meanwhile, although the example shown in FIG. 6 has been described as temporarily bonding and sintering the object 40 only to the lower substrate 20, the main bonding step in which the upper substrate 30 is bonded and sintered to the object 40 in the state of temporarily bonding the object 40 to the lower substrate 20 may be performed.

In the method for manufacturing a power module substrate according to the first embodiment of the present disclosure described above, the base film 11 may control the flatness of the lower surface of the adhesive layer 13, and the flatness of the upper surface of the adhesive layer 13 may be controlled by the pressing force of the upper chuck 3, so that it is possible to form the adhesive layer 13 to have a thin and uniform thickness.

In addition, in the method for manufacturing a power module substrate according to the first embodiment of the present disclosure described above, since the bonding process is completed by bonding the semiconductor chip 40*a* and the first conductive spacers 40*b* onto the lower substrate 20 in a stacked manner by using the adhesive transfer film 10 and then performing a final one-time sintering process, the process can be minimized, the process time can be reduced, and the equipment investment cost is also reduced.

When the operation of temporarily bonding the semiconductor chip 40*a* to the lower substrate 20 and temporarily bonding the first conductive spacer 40*b* to the semiconductor chip 40*a* is performed using Ag sintering paste, it is inconvenient to temporarily bond the semiconductor chip 40*a* and the first conductive spacer 40*b* to the lower substrate 20 and then perform first sintering, and additionally apply an Ag sintering paste on the first conductive spacer 40*b* to bond the upper substrate 30 to the first conductive spacer 40*b* and perform secondary sintering, but it is difficult to apply the Ag sintering paste uniformly. In addition, because the pressing is performed for each sintering process, the process time is lengthened, and expensive equipment is required for the application of the Ag sintering paste, thereby increasing the equipment investment cost. Therefore, it is effective to manufacture Ag sintering paste in the form of a film and apply it to a method for manufacturing a power module substrate in terms of reducing process time and equipment investment cost.

Hereinafter, an adhesive transfer film according to a second embodiment of the present disclosure and a method for manufacturing a power module substrate by using the same will be described with reference to FIGS. 7 to 12. For convenience of description, descriptions of the same components as those of the first embodiment shown in FIGS. 1 to 6 will be omitted, and differences will be mainly described below.

As shown in FIG. 7, the adhesive transfer film 10 according to the second embodiment of the present disclosure is manufactured by forming Ag sintering paste on a film in the form of a pattern.

The adhesive transfer film 10 may be formed by attaching an OCA film on the base film 11 and printing Ag sintering paste in a pattern form on the OCA film and drying it. Alternatively, the adhesive transfer film 10 may be formed by printing Ag sintering paste in a pattern form on the base film 11 and drying it. In the scheme of printing the adhesive layer 13 in a pattern form, mesh screen printing or stencil printing may be applied to uniformly control the height of the adhesive layer 13. In the stencil printing, a stencil metal mask having a pattern-shaped hole is disposed on the upper surface of the base film 11 and screen-printed to form an adhesive layer pattern of a certain thickness. The mesh screen printing is a printing scheme of transferring an adhesive layer pattern onto a base film by using a screen mesh. As the mesh screen, a screen mesh is used, which is manufactured by chemically treating (coating) a certain area of a finely woven fabric type to form a film on the mesh to prevent the paste from passing therethrough and to transmit the paste through the development operation of only a part of the desired image area.

FIG. 8 illustrates a method for manufacturing a power module substrate by using an adhesive transfer film according to a second embodiment of the present disclosure.

As shown in FIG. 8, in the method for manufacturing a power module substrate according to the second embodiment of the present disclosure, the adhesive layer 13 may be transferred to the object 40 using the adhesive transfer film 10, and the object 40 to which the adhesive layer 13 is transferred may be temporarily bonded to the upper surface of the lower substrate 20. The adhesive layer 13 is formed on the base film 11 in a pattern shape corresponding to a position corresponding to the object 40. As described above, when the adhesive layer 13 is formed on the base film 11 in a pattern shape corresponding to the position corresponding to the object 40, it is possible to reduce the amount of the adhesive transfer film 10 used and defects caused by burrs.

A method for manufacturing a power module substrate includes a preparing step of preparing the adhesive transfer film 10, a temporary bonding step of transferring an adhesive layer on the adhesive transfer film to an object, and temporarily bonding the object to which the adhesive layer is transferred to a lower substrate by a medium of the adhesive layer, and a main bonding step of bonding the upper substrate 30 to an upper portion of the object 40 temporarily bonded on the lower substrate 20 and performing sintering to main bond the object 40 between the lower substrate and the upper substrate 30.

In the preparing step, the adhesive layer 13 is pre-coated on the base film 11 in a pattern shape corresponding to the position corresponding to the object.

The preparing step includes preparing the base film 11, forming the sticky layer 12 on the base film 11, and forming the adhesive layer 13 having a pattern shape on the adhesive layer 12 by a stencil printing or mesh screen printing scheme. As an example, the preparing step includes attaching an OCA film on a PET film, and applying or printing an Ag sintering paste on the OCA film, and drying it to form the Ag adhesive layer. As the base film 11, a polycarbonate (PC) film may be used in addition to a polyester (PET) film. However, compared to the PC film, the PET film is advantageous in maintaining the flatness of the lower surface of the adhesive layer 13. The flatness of the upper surface of the adhesive layer 13 may be controlled by the pressing force of the upper chuck 3. When the flatness of the adhesive layer 13 is not good, the adhesive layer is bent during sintering.

As shown in FIG. 8, the temporary bonding step includes step s1 of fixing the adhesive transfer film 10 to a die 1 and fixing the object 40 to an upper chuck 3 for adsorbing and fixing the object 40 by using a vacuum, step s2 of transferring the adhesive layer 13 on the adhesive transfer film 10 to the object 40 by pressing the object 40 fixed to the upper chuck 3 toward the adhesive transfer film 10 while heating the upper chuck 3 and the die 1, respectively, step s3 of raising the object 40 to which the adhesive layer 13 is attached by raising the upper chuck 3 while maintaining a vacuum, step s4 of transferring the upper chuck 3 to an upper portion of the lower substrate 20, step s5 of temporarily bonding the object 40 to the lower substrate 20 by pressing the object 40 fixed to the upper chuck 3 toward the lower substrate 20, and step s6 of releasing the vacuum of the upper chuck 3 and raising the upper chuck 3. The steps s1 to s3 are steps of transferring the adhesive layer 13 from the adhesive transfer film 10 to the object 40, and the steps s5 and s6 are steps of temporarily bonding the object 40 to which the adhesive layer 13 is transferred object 40 to the lower substrate 20.

After the temporary bonding step, performed is a step of main bonding the object 40 between the lower substrate 20 and the upper substrate 30 by bonding and sintering the upper substrate (refer to reference numeral 30 in FIG. 4) to the upper portion of the object 40 temporarily bonded on the lower substrate 20. The sintering may be performed for 2 to 5 minutes while heating and pressing at 240 to 300° C. The pressing may be performed in the range of 8 to 15 MPa.

FIG. 9 illustrates a method for manufacturing a power module substrate according to an embodiment of the present disclosure, which includes temporarily bonding a semiconductor chip, a first conductive spacer, and a second conductive spacer to the lower substrate, and bonding and sintering the upper substrate thereon.

As illustrated in FIGS. 9A and 9B, a method for manufacturing a power module substrate includes a first temporary bonding step s10 of transferring the adhesive layer 13 on the adhesive transfer film 10 to a lower surface of the semiconductor chip 40*a*, and temporarily bonding the semiconductor chip 40*a* to which the adhesive layer 13 is transferred to an upper surface of the lower substrate 20 by medium of the adhesive layer 13, and a second temporary bonding step s20 of transferring the adhesive layer 13 on the adhesive transfer film 10 to the lower surface of the first conductive spacer 40*b* and the lower surface of the second conductive spacer 40*c*, and temporarily bonding the first conductive spacer 40*b* and the second conductive spacer 40*c* to which the adhesive layer 13 is transferred to the upper surface of the semiconductor chip 40*a* and the upper surface of the lower substrate 20 by medium of the adhesive layer 13, respectively.

In the first temporary bonding step s10, because the adhesive layer 13 is formed on the base film 11 in a shape corresponding to a position corresponding to the semiconductor chip 40*a*, clean transfer is possible without burrs.

In the second temporary bonding step s20, the first conductive spacer 40*b* and the second conductive spacer 40*c* are interconnection spacers (CQC). The height of the second conductive spacer 40*c* is the same as the sum of the heights of the semiconductor chip 40*a*, the adhesive layer 13, and the first conductive spacer 40*b*

The lower substrate 20 may be an AMB substrate or a DBC substrate. In the first and second temporary bonding steps s10 and s20, the upper chuck 3 fixes the semiconductor chip 40*a*, the first conductive spacer 40*b*, and the second conductive spacer 40*c* to the upper chuck 3 by vacuum suction.

After the second temporary bonding step s20, performed is the main bonding step of bonding and sintering the upper substrate 30 to the upper portions of the first conductive spacer 40*b* and the second conductive spacer 40*c* temporarily bonded to the lower substrate 20, thereby main bonding the semiconductor chip 40*a*, the first conductive spacer 40*b*, and the second conductive spacer 40*c* between the lower substrate 20 and the upper substrate 30.

As shown in FIG. 9C, the main bonding step includes step s30 of forming the adhesive layer 13 on the lower surface of the upper substrate 30 to be placed to correspond to the first conductive spacer 40*b* and the second conductive spacer 40*c* that are temporarily bonded on the lower substrate 20, and step s40 of fixing the upper substrate 30 to an upper chuck 3, and main bonding a temporary bonding body 40' of the semiconductor chip 40*a* and the first conductive spacer 40*b*, and the second conductive spacer 40*c* between the upper substrate 30 and the lower substrate 20 by heating and pressing the upper substrate 30 fixed to the upper chuck 3 toward the lower substrate 20. In the main bonding step, the heating and pressing are performed for 2 to 5 minutes at a temperature of 240 to 300° C. and a pressure of 8 to 15 MPa.

The adhesive layer 13 of the temporary bonding step becomes a sintered adhesive layer 13' after performing the main bonding step. Because the sintered adhesive layer 13' is dense without voids by pressing and sintering, the bonding strength is improved and the sintered adhesive layer 13' functions as an excellent heat dissipation electrode.

FIG. 10 illustrates another example of the method for manufacturing a power module substrate according to the second embodiment of the present disclosure.

The method for manufacturing a power module substrate enables mass production by using a patterned adhesive layer.

As shown in FIG. 10A, the plurality of semiconductor chips 40a may be fixed to the upper chuck 3 manufactured in the form of a jig to fix the plurality of semiconductor chips 40a. As shown in FIG. 10B, the adhesive transfer film 10 may be manufactured such that the adhesive layer 13 is formed in a pattern shape corresponding to positions corresponding to the semiconductor chips 40a. In this case, because the semiconductor chips 40a may be fixed at each position and the adhesive layer 13 may be transferred to the semiconductor chips 40a at a time through a one-time heating and pressing process, the temporary bonding process time may be significantly reduced.

As shown in FIG. 11, the upper chuck 3 is provided with a vacuum suction line S, so that the semiconductor chip 40a may be fixed at a set position by vacuum suction. The adhesive transfer film 10 is formed with the adhesive layer 13 in a pattern shape corresponding to a position corresponding to the semiconductor chip 40a. The adhesive layer 13 is pre-printed on the base film 11 and dried.

As shown in FIG. 12, according to the method for manufacturing a power module substrate capable of mass production, the adhesive transfer film 10 having a patterned adhesive layer 13 is fixed to the die 1, and the semiconductor chips 40a are fixed to the upper chuck 3 by using a vacuum suction line S. Next, the upper chuck 3 is heated with the heating and pressing press 5, and the semiconductor chips 40a fixed to the upper chuck 3 are pressed toward the adhesive transfer film 10 while heating the die 1 with a heater, thereby transferring the adhesive layers 13 on the adhesive transfer film 10 to the semiconductor chips 40a. Next, while maintaining the vacuum, the upper chuck 3 is raised to raise the semiconductor chips 40a to which the adhesive layer 13 is attached.

The die 1 is heated to a temperature of 80 to 100° C. by using an internal heater, and the upper chuck 3 is heated to a temperature of 100 to 170° C. by using the heating and pressing press 5. Preferably, the die is heated to a temperature of 80 to 100° C., and the heating and pressing press 5 is heated to a temperature of 160° C. The pressing may be performed at 1 to 4 MPa. When the heating temperature of the heating and pressing press 5 is higher than the heating temperature of the die 1, the adhesive layers 13 may be strongly adhered to the semiconductor chips 40a having a higher temperature.

As shown in FIG. 12, the adhesive layer 13 attached to the semiconductor chip 40a has an end contracted due to the temperature of the transfer process. Because the patterned adhesive layer 13 is transferred to the semiconductor chip 40a, it is possible to significantly reduce the burr factor that may occur when transferring.

When the adhesive layer 13 is formed on the entire surface of the base film 11 and the adhesive layer 13 is transferred to the semiconductor chip, the end of the adhesive layer 13, which is transferred to the semiconductor chip 40a while the upper chuck 3 is raised, may be torn off to generate burrs.

As described above, the method for manufacturing a power module substrate according to the second embodiment of the present disclosure is capable of mass production by patterning the adhesive layer 13. That is, the semiconductor chips 40a may be arranged in advance to correspond to the positions at which they are to be mounted on a power module by using the upper chuck 3 manufactured in the form of a jig. Then, the adhesive transfer film 10 having the adhesive layer 13 patterned to transfer the adhesive layer to the position of the semiconductor chip 40a on the upper chuck 3 may be prepared, and the adhesive layer 13 may be transferred to the lower surface of the semiconductor chip 40a through heating and pressing. Thus, the semiconductor chip may be temporarily bonded to the DBC substrate or AMB substrate with one transfer, so that it is possible to reduce the amount of adhesive transfer film used and greatly reduce the temporary bonding process time. In addition, because the patterned adhesive layer is attached to the semiconductor chip in a one-to-one correspondence, it may be effective in that it is possible to greatly reduce the generation of residues during transfer, and the area of the adhesive layer using Ag is greatly reduced, thereby significantly reducing the product cost.

Hereinafter, an adhesive transfer film according to a third embodiment of the present disclosure and a method for manufacturing a power module substrate by using the same will be described with reference to FIGS. 13 to 15. For convenience of description, descriptions of the same components as those of the first embodiment shown in FIGS. 1 to 6 will be omitted, and differences will be mainly described below.

As shown in FIG. 13, the adhesive transfer film 10 according to the third embodiment of the present disclosure is an Ag coated dry film which is prepared by coating Ag sintering paste on a PET film and drying it, where the adhesive layer 13 has a multilayer structure. The adhesive layer 13 may be three layers or more. The adhesive layer 13 includes a first adhesive layer 13a laminated on a top surface of the sticky layer 12, a second adhesive layer 13b laminated on a top surface of the first adhesive layer 13a, and a third adhesive layer 13c laminated on a top surface of the second adhesive layer 13b.

The average particle diameter of the Ag powder particles included in the first adhesive layer 13a and the third adhesive layer 13c is different from the average particle diameter of the Ag powder particles included in the second adhesive layer 13b. Preferably, the average particle diameter of the Ag powder particles included in the second adhesive layer 13b is relatively smaller than that of the Ag powder particles included in the first adhesive layer 13a and the third adhesive layer 13c. When the adhesive layer 13 is formed in a multilayer structure and the average particle diameter of Ag powder particles included in each layer is different, the shrinkage rate during sintering differs.

As in the embodiment, when the Ag powder particles, which are included in the second adhesive layer 13b which is the intermediate layer and have an average particle diameter which is relatively smaller than the average particle diameter of the Ag powder particles included in the third adhesive layer 13c and the first adhesive layer 13a which are upper and lower layers of the second adhesive layer 13b are applied, during sintering, the shrinkage rate of the second adhesive layer 13b having a relatively small average particle diameter is greater than that of the first adhesive layer 13a and the third adhesive layer 13c, so that the shape of both ends of the adhesive layer 13 may be controlled to be concave. When the shape of both ends of the adhesive layer 13 is controlled to be concave, stress in the central portion of the adhesive layer 13 may be relieved to increase the breaking strength (tensile strength).

Furthermore, the adhesive layer 13 may enable dense sintering even when the adhesive layer 13 having a thick overall thickness is applied by applying Ag powder particles having a small average particle diameter to the center.

In the fracture phenomenon due to flexure due to thermal stress, in most cases, fracture proceeds as cracks occur along the bonding surface of heterogeneous interfaces. However, when the adhesive layer 13 has a multi-layer structure, the bonding strength is enhanced during sintering of a single material, so that the center of the sintered adhesive layer 13 is more likely to be the starting point of cracks than the bonding surface of the heterogeneous interface.

That is, by forming the adhesive layer 13 having a multi-layer structure using an Ag sintering paste in which Ag particle sizes are clearly distinguished, it is possible to prevent the occurrence of cracks at the heterogeneous interface. In addition, the shape of both ends of the adhesive layer 13 may be controlled by configuring layers differently from each other so that the shrinkage rate is different depending on the Ag particle size to prevent cracks from occurring in the center of the adhesive layer 13. Thus, the stress in the center of the adhesive layer 13 is relieved to increase the breaking strength.

As shown in FIG. 13, the adhesive layer 13 having a multilayer structure on the adhesive transfer film 10 is transferred to the object 40, and then the upper chuck 3 fixing the object 40 heats and presses the object 40 toward the substrate 20, thereby sintering and bonding the object 40 and the substrate 20. The shape of both ends of the sintered adhesive layer 13" is a concave shape by the second adhesive layer 13b, in which relative shrinkage occurs more than that of the first adhesive layer 13a and the third adhesive layer 13c, and stress relief in the center is possible. In addition, the sintered adhesive layer 13" has a high thermal conductivity because it has a higher sintered density than the others at the center. The thermal conductivity is high at the minimum pore condition.

As shown in FIG. 14, Ag powder particles included in the adhesive layer 13 are made of flake form nanoparticles. Specifically, the first adhesive layer 13a to the third adhesive layer 13c include Ag powder particles made of flake form nanoparticles, and the average particle diameter of the Ag powder particles included in the second adhesive layer 13b is relatively smaller than that of the Ag powder particles included in the first adhesive layer 13a and the third adhesive layer (13c).

The Ag powder particles formed in a flake form improve sinterability while minimizing the amount of organic binder. Moreover, the Ag powder particles in the flake form have less shrinkage during sintering, better bonding strength, and higher shear strength compared to the Ag powder particles of a nano-size sphere form. When the amount of the organic binder in the adhesive layer 13 is large, gas may be generated when the temperature rises to 350 to 400° C. due to overvoltage, and cracks may occur in the adhesive layer. Accordingly, the embodiment includes Ag powder particles made of flake form nanoparticles such that the content of the organic binder is minimized and the content of Ag powder particles is maximized. In an embodiment, the flake form has a flat elliptical shape with a thickness of several nanometers.

As described above, the adhesive transfer film 10 is an Ag coated dry film in which an Ag sintering paste is coated three times or more on a PET film and dried to form an Ag adhesive layer having a multilayer structure on a base film.

The method for manufacturing a power module substrate using the adhesive transfer film 10 according to the third embodiment of the present disclosure includes a preparing step of preparing the adhesive transfer film 10, a temporary bonding step of transferring an adhesive layer on the adhesive transfer film to an object, and temporarily bonding the object to which the adhesive layer is transferred to a lower substrate by a medium of the adhesive layer, and a main bonding step of bonding the upper substrate 30 to an upper portion of the object 40 temporarily bonded on the lower substrate 20 and sintering to main bond the object 40 between the lower substrate and the upper substrate 30.

In this case, the preparation step is a step of pre-coating an adhesive layer 13 on the base film 11.

The preparing step includes preparing the base film 11, forming the sticky layer 12 on the base film 11, and forming the adhesive layer 13 having a multi-layer structure by coating and drying the Ag sintering paste on the sticky layer 12 three times or more.

For example, the preparing step includes attaching an OCA film on a PET film, and forming an Ag adhesive layer composed of three layers by applying or printing an Ag sintering paste on the OCA film and performing drying three times.

The Ag adhesive layer employs an Ag powder particles of the second adhesive layer 13 constituting an intermediate layer, which have the average particle diameter relatively smaller than the average particle diameter of the Ag powder particles of the third adhesive layer 13 and the second adhesive layer 13 formed on the upper and lower portions of the intermediate layer, so that the shape of both ends of the Ag adhesive layer is controlled to relieve the stress of the intermediate layer during sintering. In addition, the Ag adhesive layer uses Ag powder particles having a flake form.

As shown in FIG. 15, although the adhesive layer 13" having the multilayer structure sintered through the temporary bonding step and the main bonding step shrinks, the shrinkage rate is as small as about 6%. Moreover, the adhesive layer 13 does not shrink well up and down, and small shrinkage occurs on both sides because Ag constituting the adhesive layer 13 has a flake form. The flake form increases the bonding strength of the adhesive layer 13" to improve the breaking strength.

Table 1 below shows the characteristics of the Ag adhesive layer (embodiment) and the Sn—Ag solder layer (comparative example) obtained by sintering the adhesive layer according to the third embodiment of the present disclosure compared to pure Ag. The Ag adhesive layer according to the third embodiment includes 98 to 99 wt % of Ag powder and 1 to 2 wt % of a binder.

TABLE 1

| Classification | Pure Ag | Ag sintered layer (adhesive layer) | Sn—Ag solder layer |
|---|---|---|---|
| Liquidus (° C.) | 961 | 961 | 221 |
| Electrical Conductivity (MS/m) | 68 | 41 | 7.8 |

TABLE 1-continued

| Classification | Pure Ag | Ag sintered layer (adhesive layer) | Sn—Ag solder layer |
|---|---|---|---|
| Thermal Conductivity (W/mK) | 429 | 200 | 70 |
| Density (g/cm3) | 10.5 | 8.2 | 8.4 |
| CTE (ppm/° C.) | 19.3 | 19 | 28 |
| Tensile strength (MPa) | 139 | 55 | 30 |

As shown in Table 1, the Ag adhesive layer according to the third embodiment of the present disclosure has a high thermal conductivity of 200 W/mK, and a tensile strength of 50 MPa or more which is higher than that of a Sn—Ag solder layer. Thus, it may be understood that the thermal conductivity and tensile strength of the Ag adhesive layer according to the third embodiment of the present disclosure are superior to those of the Sn—Ag solder layer.

FIG. 16 is a view illustrating a flexure that occurs while repeating cooling and heating in a semiconductor chip of a power module. FIG. 17 is an SEM photograph comparing crack characteristics by applying an Ag adhesive layer (third embodiment) according to an embodiment of the present disclosure and Sn solder (comparative example) to a power module.

As shown in FIG. 16, the operating temperature of the semiconductor chip of the power module is 150 to 250° C., and the flexure occurs while cooling and heating is repeated.

As shown in FIGS. 17A and 17B, when a semiconductor chip is bonded to a substrate with a Sn solder (SAC305, SN100C), as the result of 800 tests at an operating temperature of −40 to 125° C., cracks occurred on the Sn solder bonding surface as shown in the SEM photograph.

Meanwhile, as shown in FIG. 17C, the Ag adhesive layer according to the third embodiment of the present disclosure was tested 800 times at an operating temperature of −40 to 125° C., and no cracks were observed.

FIG. 18 is an SEM photograph and graph illustrating a microstructure according to the binder content of the Ag adhesive layer (third embodiment) of the present disclosure. FIG. 19 is an SEM photograph and graph illustrating a microstructure according to the binder content of Sn solder (comparative example).

In detail, FIG. 18A is an SEM photograph of an Ag adhesive layer (third embodiment) of the present disclosure sintered at 250° C. for 10 minutes. FIG. 18B is a graph illustrating weight loss and calorimetric measurement results according to the binder content of the embodiment of FIG. 18A.

FIG. 19A is an SEM photograph of Sn solder sintered at 250° C. for 10 minutes. FIG. 19B is a graph of weight loss and calorie measured according to the binder content of the embodiment of FIG. 19A.

As shown in FIGS. 18 and 19, it may be confirmed that as the content of the binder, which is an organic material, is minimized, the pores are minimized. Thus, it may be understood that by minimizing unnecessary organic materials, excellent sintering properties are secured and cracks of the sintered layer are prevented. However, for uniform diffusion of Ag powder particles, the content of the organic binder is preferably 1 to 2 wt %. The uniform adhesive layer 13 may be formed only when the Ag powder particles are uniformly diffused.

FIG. 20 shows the Ag adhesive layer (third embodiment) of the present disclosure which is sintered at 250° C. for 30 minutes without pressing.

FIG. 20B is an enlarged view of FIG. 20A, and as a result of sintering the Ag adhesive layer at 250° C. for 30 minutes without pressure, adhesive strength of 60 MPa or more was secured. In addition, it can be confirmed that, even when the Ag adhesive layer is sintered without pressure, the organic matter is minimized, so that the thermal conductivity of at least about 150 W/mK is secured.

FIG. 21 is a photograph of the structure of the sintered Ag adhesive layer (Ag sintered layer) after press-sintering the Si semiconductor chip to which the Ag adhesive layer is transferred on the substrate. In this case, FIG. 21A is a photograph of an Ag adhesive layer formed through 150 μm mask stencil printing on a base film, and FIG. 21B is a photograph of an Ag adhesive layer formed through 200 μm mask stencil printing on a base film.

The Ag adhesive layer shown in FIGS. 21A and 21B was press-sintered at 240° C. for 4 minutes at 15 MPa. After press-sintering, a dense bonding layer with a porosity of 7 to 8% was confirmed. In FIG. 21, sufficient bonding was possible even when the sintering time was short, and adhesive strength of 50 MPa or more and thermal conductivity of about 300 W/mK were secured. It is confirmed that the porosity is secured at 7 to 8% by minimizing organic materials after sintering, and it is confirmed that the thermal conductivity is increased due to the minimum pore condition.

FIG. 21 shows that the pores are minimized by press-sintering the adhesive layer, and in FIG. 20, many pores confirmed by sintering without pressure are observed. Thus, it may be understood that the press-sintering has the effect of increasing the thermal conductivity by minimizing the pores.

FIG. 22 illustrates a comparison of the adhesive strength of the Ag adhesive layer according to the third embodiment of the present disclosure with those of other companies (comparative example).

There is Semipowerrex® (Korea) as a third-party product. In both the embodiment and the comparative example, sintering was performed at 290° C. for 150 sec.

As confirmed in FIG. 22, it may be confirmed that the embodiment obtains sufficient bonding strength within a short time of about 2 minutes at a temperature of 290° C., and the bonding strength is very high as 65 MPa or more.

FIG. 23 is a general photograph of the fracture surfaces of the embodiment and comparative example of FIG. 22. FIG. 24 is an SEM photograph of the fracture surfaces of the embodiment and comparative example of FIG. 22.

As shown in FIG. 23, in the embodiment, a portion of the Ag adhesive layer was separated, whereas in the comparative example, the bonding surface between the adhesive layer and the substrate was broken.

As shown in FIG. 24, in the shape of the fracture surface, the Ag adhesive layer was broken in the middle of the Ag adhesive layer, and in the comparative example (manufactured by other companies), the entire adhesive layer was separated from the substrate. This phenomenon is because, in the embodiment, the central portion of the Ag adhesive layer has a higher sintering density than other portions and the Ag powder particles have a flake form. In the comparative example, the Ag powder particles are almost spherical. Moreover, the embodiment bursts at about 65 MPa and the comparative example bursts at about 23 MPa.

FIG. 25 illustrates a comparison of the shrinkage rate, flexure occurrence, and microstructure of the Ag adhesive layer according to the third embodiment of the present disclosure and those of a comparative example (manufactured by another company).

The embodiment and comparative example were sintered for 60 minutes at a temperature of 270° C. in a non-pressurized state.

As shown in FIG. 25, in the embodiment, about 6% shrinkage occurred, and in the comparative example, about 24% shrinkage occurred. In addition, in the embodiment, the flexure did not occur after sintering, whereas in the comparative example, the flexure occurred after sintering. In addition, in the embodiment, a flake form was confirmed in the microstructure measured by SEM, whereas in the comparative example, a spherical form was confirmed.

From the above results, it may be confirmed that the shrinkage rate of the Ag adhesive layer of the embodiment is 20% less than that of the comparative example, and it may be understood that it contributes to reducing defects due to jig tolerance after bonding of the semiconductor chip.

FIG. 26 is a graph comparing the weight loss of the Ag adhesive layer according to the third embodiment of the present disclosure and the comparative example (manufactured by other companies). FIG. 27 is a graph of measured calories of the Ag adhesive layer according to the third embodiment of the present disclosure and the comparative example (manufactured by another company).

It is confirmed that the Ag adhesive layer according to the embodiment has a lower thermal decomposition and sintering temperature is lowered by 60 to 100° C. at an organic content of 1 to 2 wt % compared to that of the comparative example (manufactured by another company). Thus, it may be expected that the low sintering temperature enables fast sintering.

The Ag adhesive layer according to the third embodiment of the present disclosure described above may secure a thermal conductivity of 150 W/mK in non-pressure sintering, a thermal conductivity of 280 W/mK or more in pressure sintering using test equipment, and a thermal conductivity of 300 W/mK or more in using official pressure equipment.

In addition, the Ag adhesive layer according to the third embodiment of the present disclosure has a small shrinkage rate because the Ag powder particles have a flake form. In addition, because the Ag adhesive layer includes a multilayer structure and different powder particles, which has an advantage in removing residual stress, defects due to cracking after sintering may be minimized, and high breaking strength (tensile strength) of 50 MPa or more may be secured.

Best embodiments of the present disclosure are disclosed in the drawings and specification. Although specific terms have been used above, they are only used for the purpose of describing the embodiments and are not used to limit the meaning or scope of the present disclosure described in the claims. Therefore, it will be understood by those skilled in the art that various modifications and equivalent other embodiments of the present disclosure are possible therefrom. Accordingly, the true technical scope of the present disclosure should be defined by the technical spirit of the appended claims.

The invention claimed is:

1. An adhesive transfer film comprising:
a base film;
a sticky layer on the base film; and
an adhesive layer on the sticky layer,
wherein the adhesive layer is formed in a multilayer structure on the sticky layer,
wherein the adhesive layer includes:
a first adhesive layer laminated on an upper surface of the sticky layer;

a second adhesive layer laminated on an upper surface of the first adhesive layer; and
a third adhesive layer laminated on an upper surface of the second adhesive layer,
the first to third adhesive layers include Ag powders made of flake form nanoparticles, and
an average particle diameter of the Ag powder included in the second adhesive layer is relatively smaller than average particle diameters of the Ag powders included in the first adhesive layer and the third adhesive layer.

2. The adhesive transfer film of claim 1, wherein the adhesive layer includes an Ag adhesive layer, and
the Ag adhesive layer includes 97 to 99 wt % of Ag powder and 1 to 3 wt % of a binder.

3. The adhesive transfer film of claim 1, wherein the base film includes a PET film, and
the sticky layer includes OCA.

4. The adhesive transfer film of claim 1, wherein the adhesive layer is formed in a pattern shape on the sticky layer.

5. A method for manufacturing a power module substrate, the method comprising:
a preparing step of preparing an adhesive transfer film;
a temporary bonding step of transferring an adhesive layer on the adhesive transfer film to a component to be mounted on the power module substrate, and temporarily bonding the component to which the adhesive layer is transferred to a lower substrate by medium of the adhesive layer; and
a main bonding step of bonding an upper substrate to an upper portion of the component temporarily bonded on the lower substrate and sintering to main bond the component between the lower substrate and the upper substrate.

6. The method of claim 5, wherein the preparing step includes:
preparing a base film;
forming a sticky layer on the base film; and
forming an adhesive layer on the sticky layer.

7. The method of claim 5, wherein the preparing step includes:
attaching an OCA film on a PET film; and
forming an Ag adhesive layer by applying or printing Ag sintering paste on the OCA film and drying the Ag sintering paste applied or printed on the OCA film.

8. The method of claim 5, wherein the preparing step includes:
preparing the adhesive transfer film to form an adhesive layer having a pattern shape corresponding to a position of the component.

9. The method of claim 5, wherein the preparing step includes:
attaching an OCA film on a PET film; and
mesh screen printing or stencil printing Ag sintering paste on the OCA film, and drying to form an Ag adhesive layer having a pattern shape.

10. The method of claim 5, wherein the preparing step includes:
preparing a base film;
forming a sticky layer on the base film; and
forming the adhesive layer having a multilayer structure by coating Ag sintering paste on the sticky layer and drying the Ag sintering paste coated on the sticky layer three times or more.

11. The method of claim 5, wherein the temporary bonding step includes:

fixing the adhesive transfer film to a die and fixing the component to an upper chuck for adsorbing and fixing the component using a vacuum;

transferring the adhesive layer on the adhesive transfer film to the component by pressing the component fixed to the upper chuck toward the adhesive transfer film while heating the upper chuck and the die, respectively;

raising the component to which the adhesive layer is attached by raising the upper chuck while maintaining a vacuum;

transferring the upper chuck to an upper portion of the lower substrate;

temporarily bonding the component to the lower substrate by pressing the component fixed to the upper chuck toward the lower substrate; and releasing the vacuum and raising the upper chuck.

12. The method of claim 11, wherein the die is heated to a temperature of 80 to 100° C., and the upper chuck is heated to a temperature of 100 to 170° C.

13. The method of claim 5, wherein the sintering is performed for 2 to 5 minutes while heating and pressing at 240 to 300° C.

14. The method of claim 5, wherein, in the temporary bonding step, the component includes a semiconductor chip, a first conductive spacer or a second conductive spacer, and the temporary bonding step includes:

a first temporary bonding step of transferring the adhesive layer on the adhesive transfer film to a lower surface of the semiconductor chip, and temporarily bonding the semiconductor chip to which the adhesive layer is transferred to an upper surface of the lower substrate by medium of the adhesive layer;

a second temporary bonding step of transferring the adhesive layer on the adhesive transfer film to a lower surface of the first conductive spacer, and temporarily bonding the first conductive spacer to which the adhesive layer is transferred to an upper surface of the semiconductor chip by medium of the adhesive layer; and a third temporary bonding step of transferring the adhesive layer on the adhesive transfer film to a lower surface of the second conductive spacer, and temporarily bonding the second conductive spacer to which the adhesive layer is transferred to an upper surface of the lower substrate by medium of the adhesive layer.

15. The method of claim 14, wherein a height of the second conductive spacer is equal to a sum of heights of the semiconductor chip, the adhesive layer, and the first conductive spacer.

16. The method of claim 14, wherein the main bonding step includes:

forming the adhesive layer on the lower surface of the upper substrate to be placed to correspond to the first conductive spacer and the second conductive spacer that are temporarily bonded on the lower substrate; and fixing the upper substrate to an upper chuck, and main bonding a temporary bonding body of the semiconductor chip and the first conductive spacer, and the second conductive spacer between the upper substrate and the lower substrate by heating and pressing the upper substrate fixed to the upper chuck toward the lower substrate.

17. The method of claim 5, wherein an AMB substrate or a DBC substrate is used for the upper substrate and the lower substrate.

\* \* \* \* \*